United States Patent
Arvelo et al.

(10) Patent No.: US 9,497,888 B2
(45) Date of Patent: Nov. 15, 2016

(54) THERMAL TRANSFER STRUCTURE(S) AND ATTACHMENT MECHANISM(S) FACILITATING COOLING OF ELECTRONICS CARD(S)

(71) Applicant: INTERNATIONAL BUSINESS MACHINES CORPORATION, Armonk, NY (US)

(72) Inventors: Amilcar R. Arvelo, Poughkeepsie, NY (US); Levi A. Campbell, Poughkeepsie, NY (US); Michael J. Ellsworth, Jr., Poughkeepsie, NY (US); Eric J. McKeever, Poughkeepsie, NY (US); Richard P. Snider, New Paltz, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 880 days.

(21) Appl. No.: 13/778,524

(22) Filed: Feb. 27, 2013

(65) Prior Publication Data

US 2014/0238640 A1    Aug. 28, 2014

(51) Int. Cl.
*H05K 7/20* (2006.01)
*F16L 41/10* (2006.01)
(Continued)

(52) U.S. Cl.
CPC ........... *H05K 7/20254* (2013.01); *F16L 41/10* (2013.01); *F28D 15/0275* (2013.01); *F28F 9/02* (2013.01); *Y10T 29/4935* (2015.01)

(58) Field of Classification Search
CPC ............. G06F 1/20; G06F 2200/201; H05K 7/20218; H05K 7/20254; H05K 2201/064; H05K 2201/066; F28D 15/0275; F28F 9/02; F28F 3/12; F28F 9/0246
USPC ....... 361/699, 702, 718–719; 165/80.4–80.5, 165/104.33; 257/714; 285/219–221
See application file for complete search history.

(56) References Cited

U.S. PATENT DOCUMENTS 3,606,399 A * 9/1971 Zahuranec ............ F16L 15/008
285/220
3,956,673 A * 5/1976 Seid ................... H05K 7/20572
165/170

(Continued)

OTHER PUBLICATIONS

M. David et al., "Thermal Transfer Structures Coupling Electronics Card(s) to Coolant-Cooled Structure(s)", U.S. Appl. No. 13/527,947, filed Jun. 20, 2012.

*Primary Examiner* — Zachary M Pape
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooling apparatuses and coolant-cooled electronic assemblies are provided which include a thermal transfer structure configured to couple to one or more sides of an electronics card having one or more electronic components to be cooled. The thermal transfer structure includes a thermal spreader and at least one coolant-carrying channel associated with the thermal spreader to facilitate removal of heat from the thermal spreader to coolant flowing through the coolant-carrying channel(s). The cooling apparatus further includes a coolant manifold structure disposed adjacent to a socket of the electronic system within which the electronics card operatively docks, and a fluidic and mechanical attachment mechanism which facilitates selective, fluidic and mechanical coupling or decoupling the thermal transfer structure and coolant manifold structure, the attachment mechanism facilitating the flow of coolant between the coolant manifold structure and the coolant-carrying channel(s) of the thermal transfer structure.

20 Claims, 15 Drawing Sheets

(51) Int. Cl.
*F28F 9/02* (2006.01)
*F28D 15/02* (2006.01)

(56) References Cited

U.S. PATENT DOCUMENTS

| | | | |
|---|---|---|---|
| 6,538,884 B1 | 3/2003 | Wong et al. | |
| 6,942,019 B2 | 9/2005 | Pikovsky et al. | |
| 7,134,484 B2 | 11/2006 | Mok et al. | |
| 7,515,416 B2 * | 4/2009 | McBain | H05K 7/20154 165/104.33 |
| 7,894,183 B2 | 2/2011 | Chen et al. | |
| 7,965,509 B2 | 6/2011 | Campbell et al. | |
| 8,274,787 B2 | 9/2012 | Alyaser et al. | |
| 8,456,833 B2 * | 6/2013 | Eagle | H05K 7/20254 165/104.33 |
| 8,659,897 B2 * | 2/2014 | Meijer | G06F 1/20 361/679.32 |
| 8,931,546 B2 * | 1/2015 | Zaffetti | F28F 3/12 165/144 |
| 9,253,923 B2 * | 2/2016 | Arvelo | H05K 7/2039 |
| 9,265,178 B2 * | 2/2016 | Arvelo | H05K 7/2039 |
| 9,298,231 B2 * | 3/2016 | Arvelo | F28F 9/02 |
| 2004/0008490 A1 | 1/2004 | Cheon | |
| 2006/0250772 A1 | 11/2006 | Salmonson et al. | |
| 2008/0062652 A1 | 3/2008 | Lieberman et al. | |
| 2009/0034327 A1 * | 2/2009 | Yun | G11C 5/04 365/174 |
| 2010/0085712 A1 | 4/2010 | Hrehor, Jr. et al. | |
| 2010/0103619 A1 | 4/2010 | Refai-Ahmed et al. | |
| 2012/0120605 A1 | 5/2012 | Arvelo et al. | |

\* cited by examiner

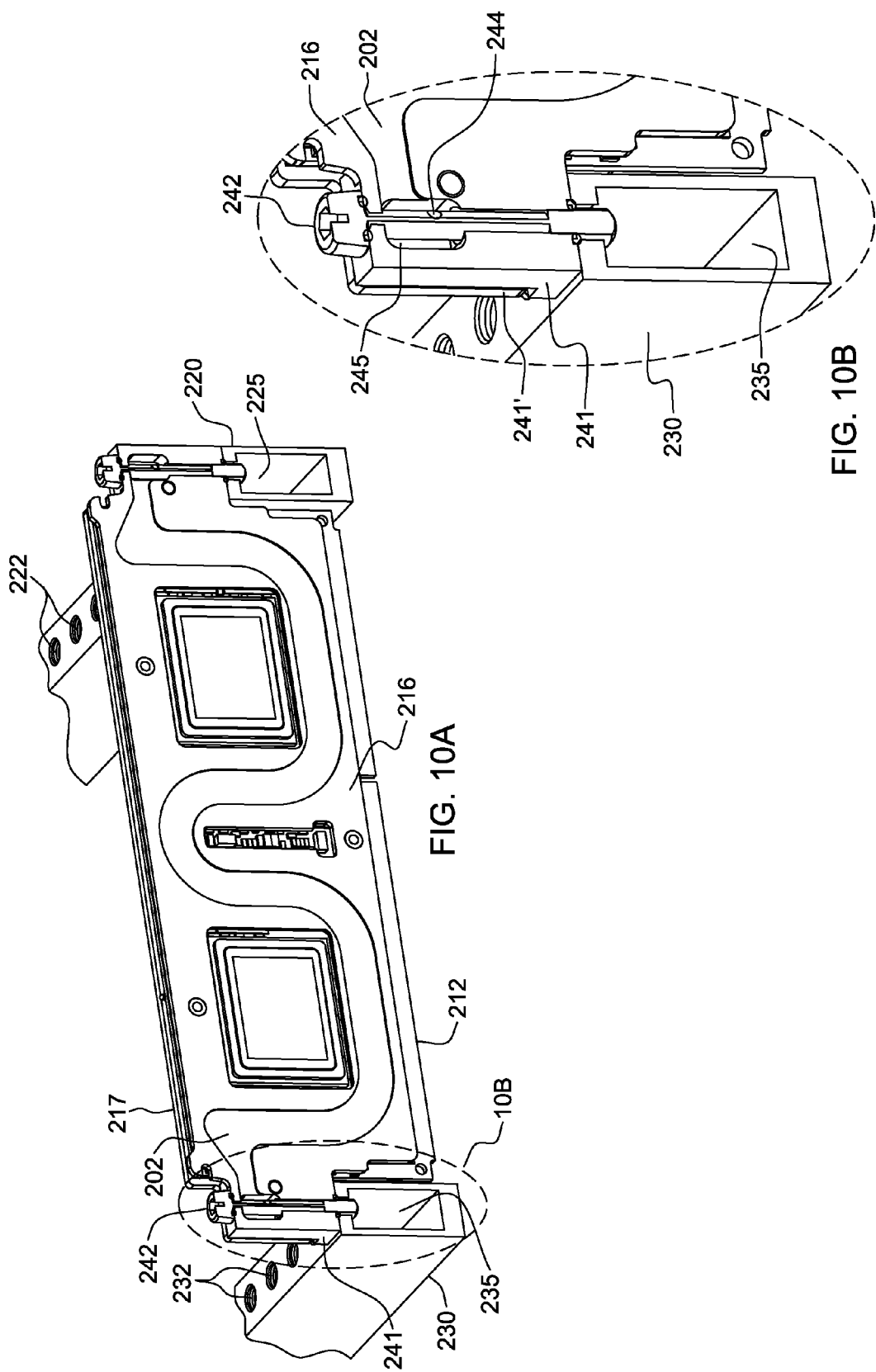

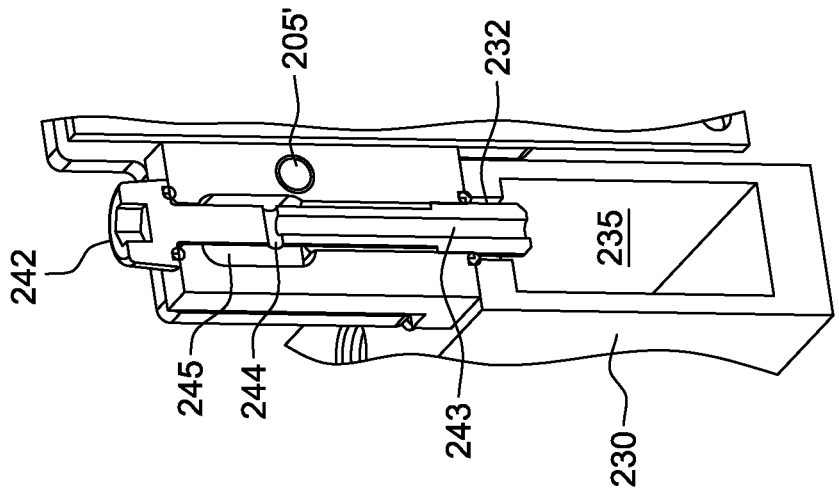
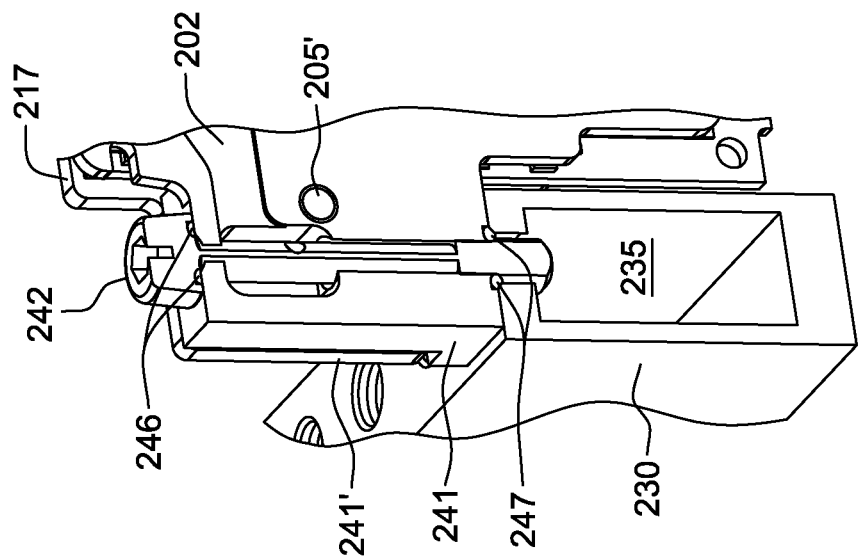

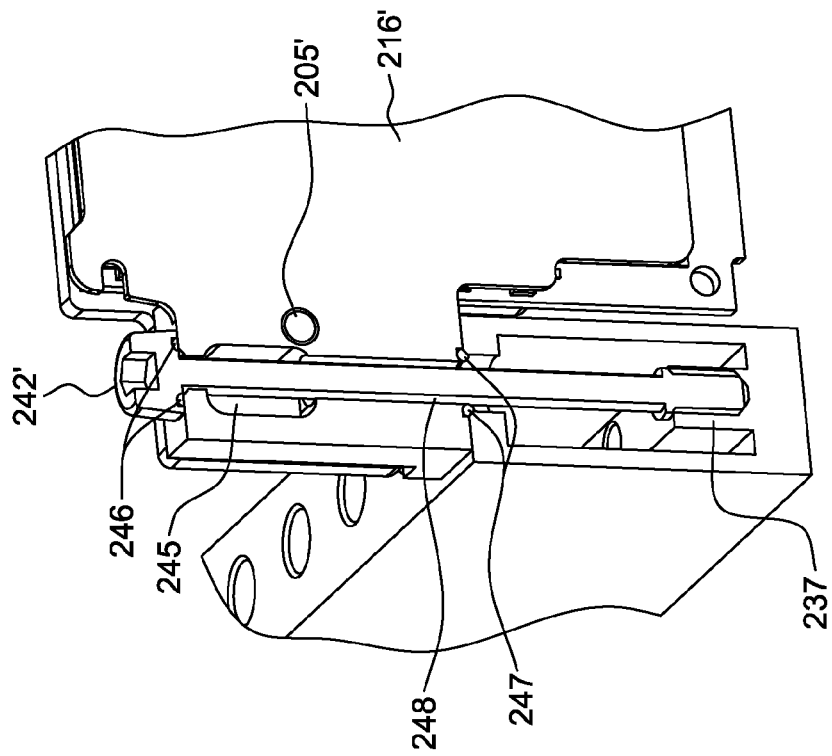
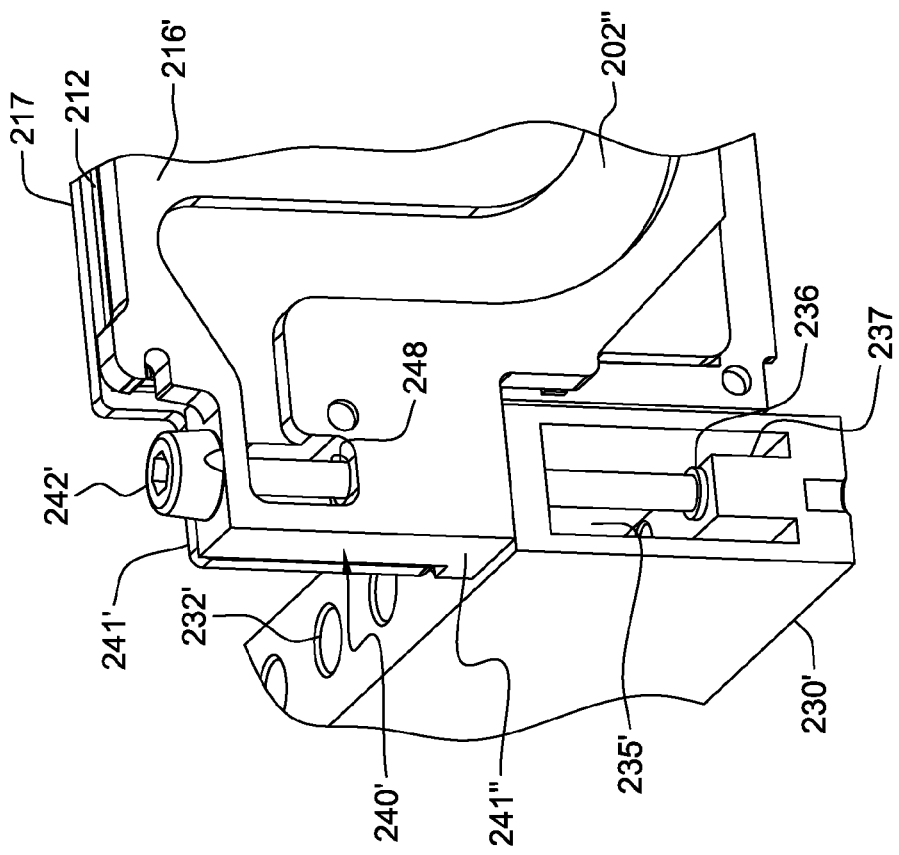

THERMAL TRANSFER STRUCTURE(S) AND ATTACHMENT MECHANISM(S) FACILITATING COOLING OF ELECTRONICS CARD(S)

BACKGROUND

As is known, operating electronic components, such as processor modules, produce heat. This heat should be removed from the components in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern electronic components and electronic systems containing such components, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

The shortcomings of the prior art are overcome and additional advantages are provided through the provision, in one aspect, of a cooling apparatus which includes a thermal transfer structure, a coolant manifold structure, and a fluidic and mechanical attachment mechanism. The thermal transfer structure is configured to couple to at least one side of an electronics card comprising one or more electronic components to be cooled. The electronics card operatively docks within a socket of an electronic system, and the thermal transfer structure includes a thermal spreader, and at least one coolant-carrying channel associated with the thermal spreader for removing heat from the thermal spreader to coolant flowing through the at least one coolant-carrying channel. The coolant manifold structure is disposed adjacent to the socket of the electronic system within which the electronics card is to operatively dock, and the fluidic and mechanical attachment mechanism selectively, fluidically and mechanically couples or decouples the thermal transfer structure and coolant manifold structure. The fluidic and mechanical attachment mechanism facilitates the flow of coolant between the coolant manifold structure and the at least one coolant-carrying channel of the thermal transfer structure.

In another aspect, a coolant-cooled electronic assembly is provided which includes an electronic system and a cooling apparatus. The electronic system includes an electronics card comprising one or more electronic components to be cooled, and a socket operatively receiving the electronics card. The cooling apparatus includes a thermal transfer structure, a coolant manifold structure, and a fluidic and mechanical attachment mechanism. The thermal transfer structure is coupled to at least one side of the electronics card, and includes a thermal spreader and at least one coolant-carrying channel. The thermal spreader is configured to couple to the at least one side of the electronics card, and the coolant-carrying channel(s) is associated with the thermal spreader for removing heat from the thermal spreader to coolant flowing through the at least one coolant-carrying channel. The coolant manifold structure is disposed adjacent to the socket of the electronic system within which the electronics card operatively docks, and the fluidic and mechanical attachment mechanism selectively, fluidically and mechanically couples or decouples the thermal transfer structure and coolant manifold structure. The fluidic and mechanical attachment mechanism facilitates the flow of coolant between the coolant manifold structure and the at least one coolant-carrying channel of the thermal transfer structure.

In a further aspect, a method of fabricating a coolant-cooled electronic assembly is provided. The method includes: providing an electronic assembly which includes an electronics card comprising one or more electronic components to be cooled, and a socket configured to operatively receive the electronics card therein; and providing a cooling apparatus to facilitate, at least in part, cooling of the electronics card. Providing the cooling apparatus includes: coupling a thermal transfer structure to at least one side of the electronics card, wherein the thermal transfer structure includes a thermal spreader configured to couple to at least one side of the electronics card, and at least one coolant-carrying channel associated with the thermal spreader for removing heat from the thermal spreader to coolant flowing through the at least one coolant-carrying channel; disposing a coolant manifold structure adjacent to the socket of the electronic system within which the electronics card operatively docks; and providing a fluidic and mechanical attachment mechanism which selectively, fluidically and mechanically couples or decouples the thermal transfer structure and coolant manifold structure, the fluidic and mechanical attachment mechanism facilitating the flow of coolant between the coolant manifold structure and the at least one coolant-carrying channel of the thermal transfer structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 10A depicts an embodiment of a cooling apparatus comprising a thermal transfer structure fluidically and mechanically attached to a coolant supply manifold structure and a coolant return manifold structure, in accordance with one or more aspects of the present invention;

FIG. 10B is a partial enlargement of the fluidic and mechanical attachment mechanism of the cooling apparatus of FIG. 10A, in accordance with one or more aspects of the present invention;

FIG. 10C is a further enlargement of the fluidic and mechanical attachment mechanism of the cooling apparatus of FIGS. 10A & 10B, in accordance with one or more aspects of the present invention;

FIG. 10D is a further cross-sectional elevational view of the fluidic and mechanical attachment mechanism of the cooling apparatus of FIGS. 10A-10C, in accordance with one or more aspects of the present invention;

FIG. 11A is a cross-sectional elevational view of an alternate embodiment of a fluidic and mechanical attachment mechanism for coupling a thermal transfer structure and coolant manifold structure of a cooling apparatus, in accordance with one or more aspects of the present invention; and FIG. 11B is a further cross-sectional elevational view of the fluidic and mechanical attachment mechanism of FIG. 11A, in accordance with one or more aspects of the present invention.

DETAILED DESCRIPTION

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more electronics cards or dual electronics cards (DIMMs)).

Further, as used herein, the terms "coolant-cooled structure", "coolant-cooled cold plate" and "coolant-cooled cold wall" refer to thermally conductive structures having one or more channels (or passageways) formed therein or passing therethrough, which facilitate the flow of coolant (such as liquid coolant) through the structure. In one example, the channel(s) may be formed by providing tubing extending at least partially through the coolant-cooled structure.

One example of coolant used within the cooling apparatuses and coolant-cooled electronic assemblies disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components. Like numbers with letter suffixes are used to identify similar parts in a single embodiment, and letter suffix "n" is a variable that indicates an unlimited number of similar elements.

Figure 1:
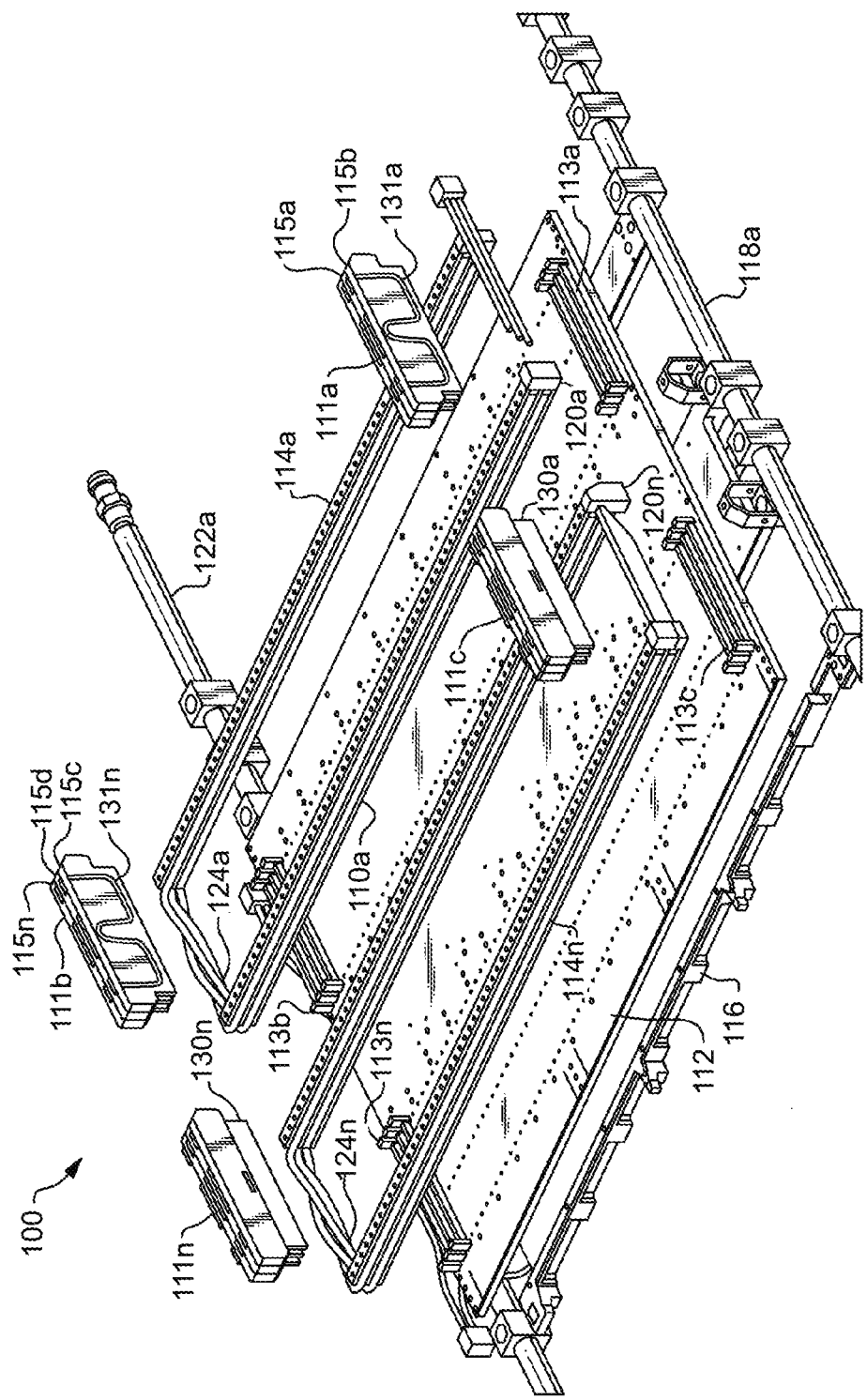
FIG. 1 is an exploded view of one embodiment of a partially-assembled, coolant-cooled electronic assembly comprising a cooling apparatus, in accordance with one or more aspects of the present invention.
Figure 2:
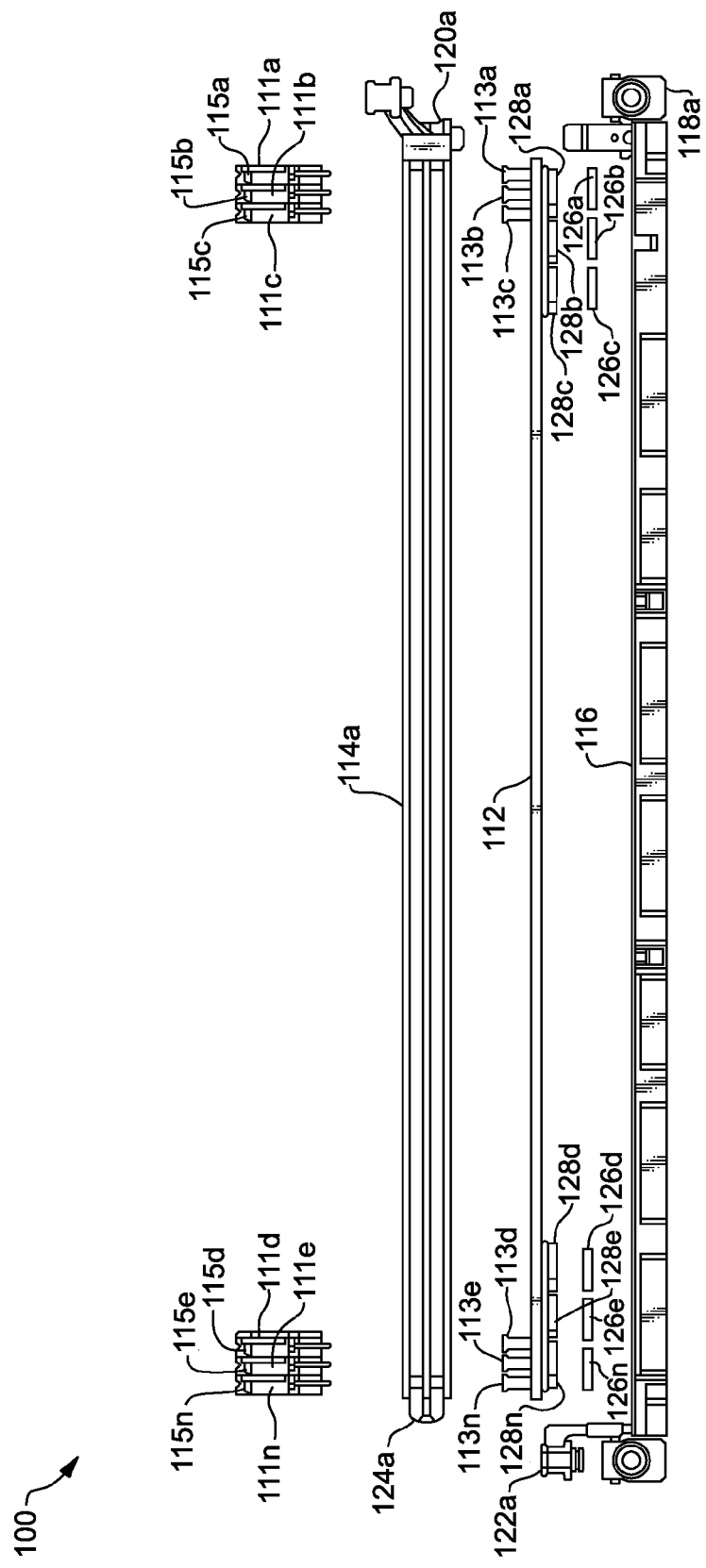
FIG. 2 is an elevational view of the partially-assembled, coolant-cooled electronic assembly of FIG. 1, in accordance with one or more aspects of the present invention.

With reference now to FIGS. 1 and 2, a cooling apparatus 100 to remove heat from one or more electronics cards or electronics card assemblies 111a-111n, and/or a circuit board 112 is initially described. In one embodiment, cooling apparatus 100 includes a cold rail 114a-114n disposed to engage each end of electronics card assemblies 111a-111n adjacent to where the cards are attachable to respective sockets (or connectors) 113a-113n coupled to circuit board 112. The cold rails 114a-114n remove heat from the electronics cards or electronics card assemblies 111a-111n. The cooling apparatus 100 may also include a cold plate 116 connected to the cold rails 114a-114n, with circuit board 112 being disposed between the cold plate and the cold rail.

In one embodiment, the cold rails 114a-114n and cold plate 116 each, or in combination, comprise an enclosed fluid pathway. In another embodiment, the cold rails 114a-114n are attachable to the circuit board 112 to aid in removing heat from the circuit board.

In a particular configuration, one side of cold rails 114a-114n is connected to a respective supply manifold 118a, another side of the cold rails 114a-114n is connected to one side of the cold plate 116 at outlets 120a-120n, and another side of the cold plate 116 is connected to a return manifold 122a. The cooling apparatus 100 may additional include cross-over tubing 124a-124n between the one side of the cold rails 114a-114n that connects to the supply manifold 118a-118n and the other side of the cold rail that connects to the cold plate 116, thereby improving heat transfer out of the electronics card assemblies 111a-111n.

In an embodiment, cooling apparatus 100 also includes thermal interface material 126a-126n adjoining cold plate 116 and components 128a-128n (e.g., electronic components carried by circuit board 112), the cold rail 114a-114n, and/or the circuit board 112. In some embodiments, the electronics card assemblies 111a-111n comprise a plurality of electronics cards that are too closely positioned for an intervening cold rail 114a-114n to fit in between any two adjacent electronics cards. Further, the electronics card assemblies 111a-111n may have no space opposite the side that is attachable to the circuit board 112 for any intervening cold rail 114a-114n or cold plate 116 to be installed.

In one embodiment, the cold rails 114a-114n engage each end of the electronics card assemblies 111a-111n with a removable fastener 115a-115n. Furthermore, the cold plate 116 may act as a circuit board 112 stiffener.

In one embodiment, cooling apparatus 100 includes cold rails 114a-114n which engage each end of electronics card assemblies 111a-111n adjacent where the cards are attachable to circuit board 112, such that the cold rails remove heat from the electronics cards. The cold rails may engage each end of the electronics card assemblies via removable fasteners 115a-115n.

In one embodiment, cooling apparatus 100 includes a cold rail 114a-114n to engage each end of electronics card assemblies 111a-111n adjacent to where the electronics cards are attachable to circuit board 112, the cold rail to remove heat from the electronics card, and the cold rail comprises an enclosed fluid pathway. The cooling apparatus 100 also includes cold plate 116 connected to the cold rail 114a-114n with the circuit board 112 between the cold plate and the cold rail, the cold plate to remove heat from the circuit board, and the cold plate comprises an enclosed fluid pathway. The cooling apparatus 100 further includes one side of the cold rail 114a-114n that connects to a supply manifold 118a-118n, another side of the cold rail that connects to one side of the cold plate 116, and another side of the cold plate that connect to a return manifold 122a-122n.

In view of the foregoing, the cooling apparatus 100 aids in cooing electronics cards 111a-111n and/or circuit board 112. As a result, the apparatus removes heat from electronics card assemblies 111a-111n, which may comprise in-line memory modules or dual-in-line memory modules (DIMMs), where packaging density prohibits air-cooling and there is inadequate space between or above the cards for cold plates, as well as removes heat from the printed circuit board 112 that is unable to be air-cooled.

In one embodiment, the cooling apparatus 100 includes two cold rails 114a-114n that efficiently remove heat from the ends of the electronics card assemblies 111a-111n packages. The cold rails 114a-114n reduce temperature variations from coolant-heating effects between the electronics card assembly 111a-111n sites and enable extreme electronics card package density. In addition, the cold rails 114a-114n remove heat generated by current flowing through the printed circuit board 112 that the electronics card assemblies 111a-111n are plugged into.

For example, a high-performance electronics card 111a-111n package can be designed to effectively move its heat to each end of the card (e.g., DIMM) by thermal conduction assisted with heat pipe 131a-131n technology. The cooling apparatus 100 provides optimized design concepts for cold rails 114a-114n at the ends of these card assemblies 111a-111n for heat removal to water or other liquid coolant.

Cooling apparatus 100 may use, for instance, machined and brazed copper construction, and/or use rectangular aluminum rails with embedded copper tubes, by way of example only. While copper cold rails 114a-114n provide improved thermal performance, an aluminum solution offers weight, cost, and reduced risk of braze joint leaking advantages. The cooling apparatus 100 provides high uniform cooling between the electronics card assembly 111a-111n sites.

Another feature of the cold rails 114a-114n is that they can cool the electronics card assemblies 111a-111n through one or more surfaces, and use another surface to cool the printed circuit board 112 that the DIMMs, processors, and other electronic components are mounted on. A suitable electrical insulator yet thermal conductor, e.g., thermal interface material (TIM), is placed between the cold rails 114a-114n and printed circuit board 112.

Another feature of the cooling apparatus 100 is it enables effective field-servicing of individual electronics cards 111a-111n for either repair or upgrade. This is achieved via, for example, threaded fasteners 115a-115n, between the electronics card assembly 111a-111n packages and the top thermal surface of cold rails 114a-114n with an aluminized indium interface material between them to ensure the TIM stays with the electronics card assemblies 111a-111n.

Figure 5:
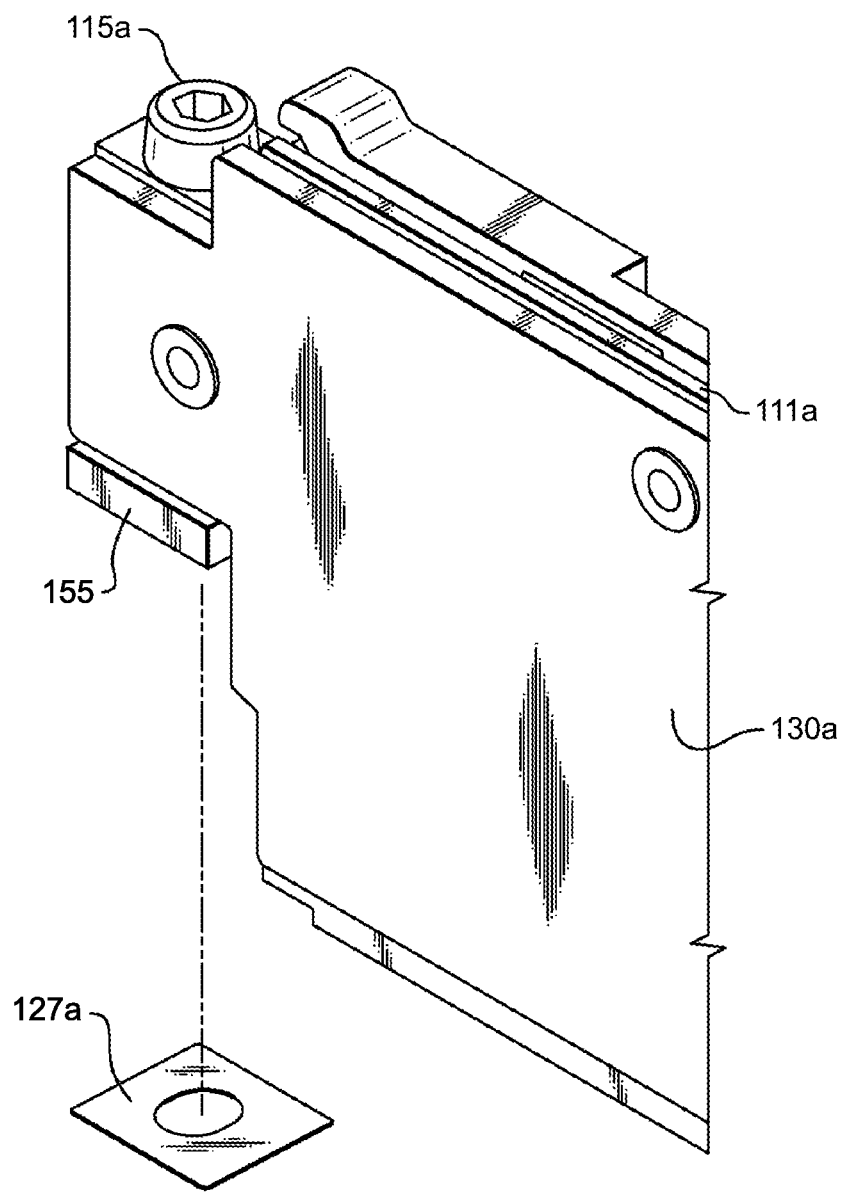
FIG. 5 depicts an example arrangement of a thermal interface material at one end of a thermal spreader of a thermal transfer structure coupled to an electronics card, in accordance with one or more aspects of the present invention.

FIG. 5 illustrates an example arrangement, wherein the mechanical features in thermal interface material 127a of thermally conductive extension 155 and pressure are used to keep the indium with the electronics card assembly 111a while handling. In this embodiment, the aluminum (non-sticking) side of the TIM 126a is facing down to cold rail 114a (see FIG. 1) such that any sticking causes further adherence to electronics card assembly 111a and not to the cold rail 114a. With the TIMs in place and cards or DIMMs attached, the height of the cold rails for card cooling is such that the electronics card power and signal connectors are properly engaged to board connector.

Figure 3A:
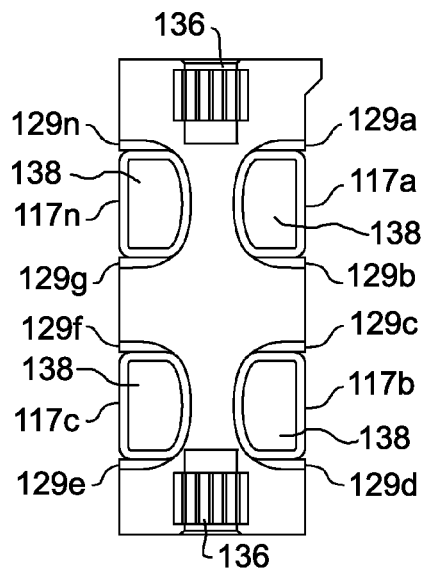
FIGS. 3A & 3B depict threaded openings and fasteners for facilitating attaching of electronics cards, such as electronics cards, from one side, and attaching of a circuit board assembly from the other side, in accordance with one or more aspects of the present invention.
Figure 3B:
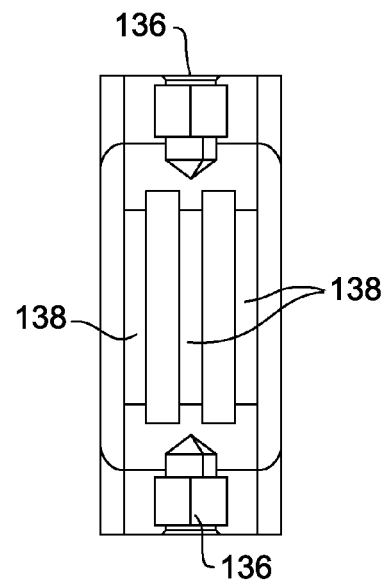

FIGS. 3A & 3B depict openings with threads or threaded inserts 136 for attaching the electronics card assemblies 111a-111n from one side and attachment to printed circuit board 112 assembly from the other side. In FIG. 3A, when the cold rails 114a-114n are coupled with patterned indium or other suitable dry interface on the electronics card assemblies 111a-111n side and an electrical insulator, thermal conductor on the board side 112, heat from both upper and lower sides of cold rails 114a-114n is transferred by conduction to the cold rails, across the thermal epoxy (or solder interface) 129a-129n and the cold rail copper tubes with "D" shape 117a-117n, and finally convected to the coolant fluid 138. Similarly, in FIG. 3B, heat from both upper and lower sides of cold rails 114a-114n is transferred by conduction to the cold rails 114a-114n, and convected to the coolant fluid 138.

One goal of electronics card assembly 111a-111n cooling is to make each card site have as equal cooling/temperature as possible. This is achieved by running the inlet coolant (e.g., water), first down one cold rail 114a-114n then back the other cold rail cooling the same set of electronics card assemblies 111a-111n. In this manner, every card attachment site between the two cold rails has same average coolant temperature. Coolant within cold rails 114a-114n may then be used to cool components 128a-128a such as voltage transformation modules ("VTMs") and/or the like which are tolerant of higher coolant temperatures, after which the coolant exits to be cooled externally.

Figure 4:
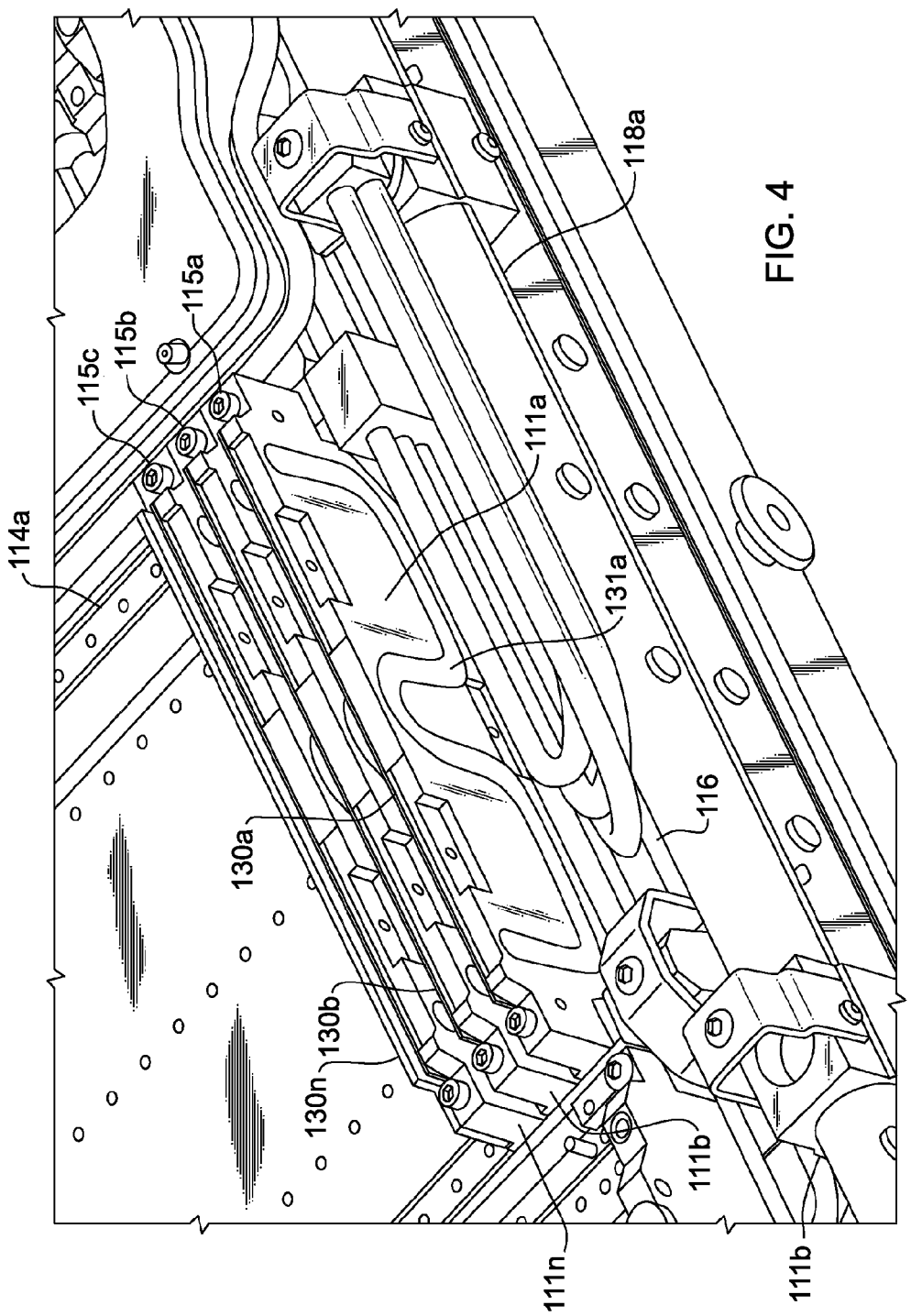
FIG. 4 depicts one embodiment of multiple thermal transfer structures coupled to electronics cards operatively disposed within the electronic system, in accordance with one or more aspects of the present invention.

FIG. 4 shows multiple electronics card assemblies 111a-111n threaded 115a-115n to cold rails 114a-114n. FIG. 4 also shows the coolant feed from a main rack manifold to cold rail 114a-114n using multiple tubes. Heat dissipated across the electronics card assemblies 111a-111n is conducted to each end of the assembly via conduction in heat spreaders, such as aluminum or copper spreaders and (in one embodiment) with the help of heat pipes 131a-131n. In another embodiment, the electronics card assemblies 111a-111n transfer heat from, for instance, memory modules of the cards through conduction using, for example, heat spreader 130a-130n and/or the like.

In one embodiment, the cold rails 114a-114n remove heat from electronics card assemblies 111a-111n thermally and mechanically attached thereto from above and from the printed circuit board 112 below. As noted, in another embodiment, the cold rail 114a-114n assembly functions to remove heat from the series of electronics card assemblies 111a-111n, where the heat of the DRAMs, ASICs, and other heat-generating parts of the electronics cards is conducted through appropriate TIMs via conductive heat spreaders 130a-130n, for instance, made of aluminum or copper, and which may include heat pipes 131a-131n or vapor chambers to facilitate heat transfer to the electronics card assembly 111a-111n ends or edges.

In one embodiment, cold rail 114a-114n that has a multitude of electronics card assemblies 111a-111n attached to it through threaded connector 115a-115n connections at each end of the assemblies' heat spreaders 130a-130n. The connectors 115a-115n mate with appropriately-spaced, threaded openings in the cold rails 114a-114n upper surface.

In one embodiment, the cold plate 116 and/or cold rail 114a-114n uses, for instance, a patterned indium or an aluminized patterned indium as the thermal interface material between the electronics card assembly 111a-111n heat spreaders and the cold plate 116 thermal conduction surface. The patterned indium is attached to the thermal spreader and is non-sticking to the colder cold plate 116 as the aluminized side faces the cold plate. This thermal path may be validated prior to applying full power to the electronics cards by monitoring thermal sensors located at hotspots within the electronics card assembly.

In one embodiment, the cold plate 116 and/or cold rail 114a-114n and electronics cards 111a-111n assembly allows for easy removal and addition of electronics cards at the factory or the customer location without moving the cold plate or breaking any coolant connections. In another embodiment, the cold plate 116 and/or cold rail 114a-114n assembly enables the inlet coolant to proceed down one side of the electronics card assemblies 111a-111n and then cross over to a second leg of the cold plate or cold rail and proceed in the reverse direction with respect to where the coolant passes by each electronics card. In this manner each electronics card assembly 111a-111n site is in a direct thermal conduction path with the same average water temperature by taking the average of the water at both ends of the electronics card, thereby improving electronics card site temperature uniformity.

In one embodiment, the cold plate 116 and/or cold rail 114a-114n assembly is constructed of copper where the coolant passes in three parallel channels in each of two legs of the cold plate assembly. This construction can be made, for instance, by machining and brazing copper plates. In another embodiment, the cold plate 116 assembly includes two legs of the cold plate interconnected in a means that mixes the water together as it is transferred from the upstream cold rail 114a-114n to the downstream cold rail.

In one embodiment, the cold plate 116 and/or cold rail 114a-114n assembly includes four copper tubes that are thermally and/or mechanically attached to an aluminum base section either with braze, solder, or with a thermal epoxy. In another embodiment, the cold plate 116 assembly includes four copper tubes in each leg of the aluminum base cold rail 114a-114n that are twisted in such a manner that the tubes that are in the upper half of the upstream cold rail are brazed to the copper tubes in the lower half of the downstream cold rail. This creates better overall electronics card 111a-111n cooling as more heat is removed from the electronics cards than from the printed circuit board 112.

In one embodiment, cold plate 116 also provides a circuit board 112 stiffener that is designed to cool Voltage Transformer Modules (VTMs) and similar power conversion devices that are soldered to the backside of a printed circuit board that has memory, processors, and other logic components on its front side. This cold plate 116 acts as a circuit board stiffener 112 and conducts heat from where it contacts the printed circuit board to the coolant tubes in the cold plate 116 of the assembly.

In one embodiment, the cold plate 116 is constructed of high-thermal-conductivity aluminum and copper tubes carrying coolant running over the region of the board where the VTMs are located. These tubes are located on the side opposite of the thermal surface closest to the VTMs to enable special surface treatments of the aluminum thermal surface. In another embodiment, the cold plate 116 has its thermal surface area directly above the VTMs roughened to between an N7 and N9 for long-term stability of the TIM material to counteract when the printed circuit board 112 and the cold plate expand and contract at different rates causing relative motion in the gap between the VTMs and the mating cold plate surface.

In another embodiment, the cold plate 116 uses a TIM material 126a-126n between the VTMs and the cold plate thermal surface that has been suitably roughened. The TIM material 126a-126n will be of sufficient elasticity to allow for compression without harming the VTMs, such as a fully-cured thermal gel. In another embodiment, the cold plate is assembled to the printed circuit board 112 at a slow enough strain rate that the compression of the TIM material 126a-126n does not produce damaging stresses to the VTMs at worst case tolerances.

In one embodiment, the cold plate 116 is designed to contact the backside of the printed circuit board 112 where VTMs are not located for purposes of providing board rigidity for plugging land grid array ("LGA") loaded modules and electronics cards 111a-111n. A suitable thin electrical insulator may be used as the interface between the printed circuit board 112 and the cold plate 116. In another embodiment, the cold plate 116 is designed to conduct heat from the printed circuit board 112 it is in mechanical contact with, especially in areas between the VTMs and processor modules where currents are highest in the board and associated resistance heating is high.

In one embodiment, the cooling apparatus 100 uses an inlet manifold feeding chilled water to multiple cold rails 114a-114n for electronics card 111a-111n cooling. The outlet water from the electronics card 111a-111n cold rails 114a-114n then feeds cold plate 116 for cooling VTMs and similar devices that are located on the reverse side of the circuit board 112 from the electronics card and other logic components. The cooling apparatus 100 also includes an outlet manifold that connects tubes from the VTM cold plate 116 outlet and returns the warmed water to be chilled outside of the drawer.

In one embodiment, the cooling apparatus 100 provides lower water temperature for cooling for the electronics card assemblies 111a-111n, then uses the warmed exit water from the card cooling to cool the less-sensitive power components. In another embodiment, the cold plate 116 assembly removes resistive loses from both sides of the printed circuit board 112 enabling high board currents that cannot be air-cooled.

In another embodiment, the cooling apparatus 100 comprises an assembly that requires only one feed and one return manifold connection while cooling components on each side of printed circuit board 112. In another embodiment, the cooling apparatus 100 provides circuit board 112 rigidity for plugging and mechanically locating electronics cards 111a-111n at a proper height in the connectors 113a-113n.

Figure 6:
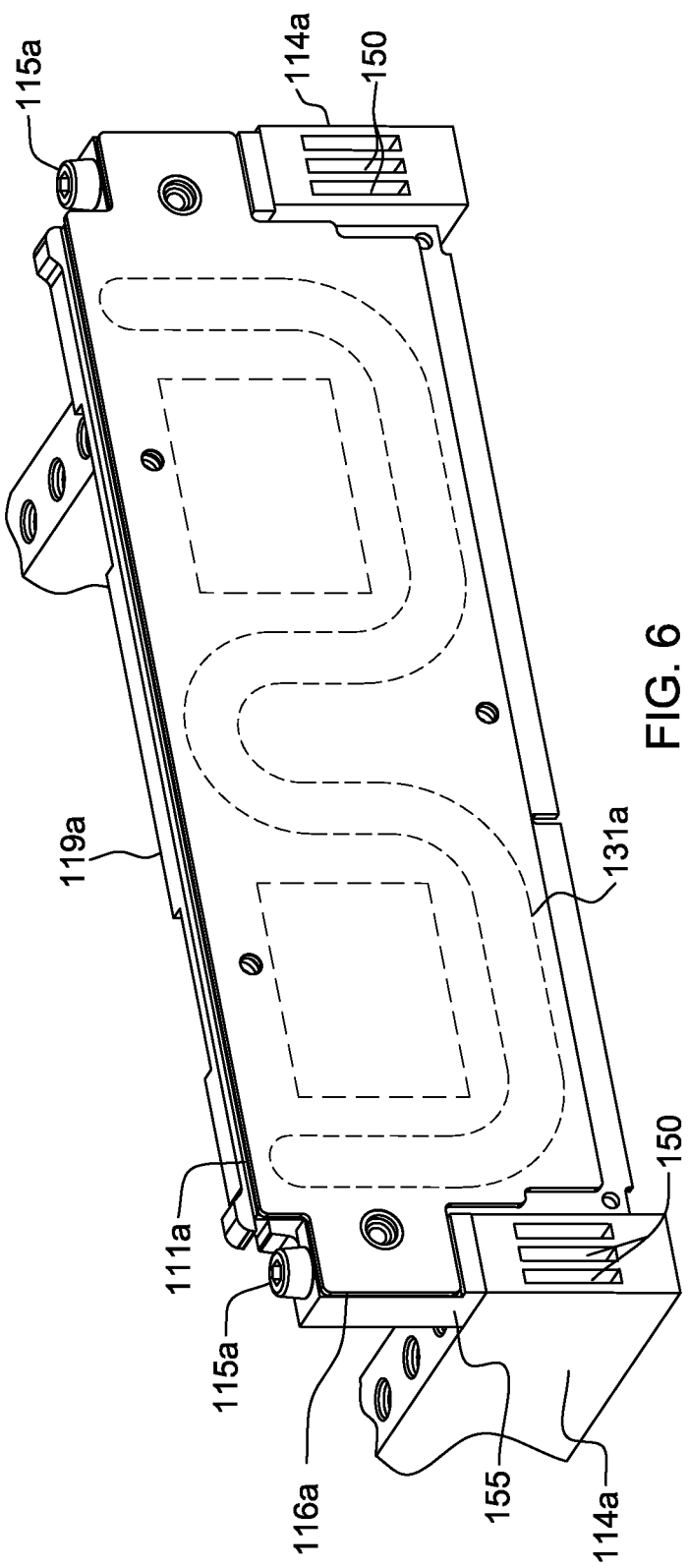
FIG. 6 is a cross-sectional elevational view of one embodiment of a thermal transfer structure and coolant-cooled cold rail of one embodiment of a cooling apparatus, in accordance with one or more aspects of the present invention.

By way of further example, FIG. 6 depicts a cross-sectional elevational view of one embodiment of an electronics card assembly 111a mounted to two parallel cold rails 114a to facilitate thermal conduction of heat from electronics card assembly 111a, through the assembly's heat spreader 116a and the thermally conductive extensions 155 thereof, to cold rails 114a disposed at opposite side ends or edges of the electronics card assembly, as illustrated. A heat pipe 131a within heat spreader 119a coupled to one side of the electronics card facilitates transfer of heat to the opposite edges thereof, and in particular to the thermally conductive extensions 155. The thermally conductive extensions 155 are coupled via, for instance, fasteners 115a to, in this embodiment, the upper surfaces of cold rails 114a. As illustrated, in one embodiment, cold rails 114a include a plurality of coolant-carrying channels 150. Cold rails 114a are configured to convect heat to coolant flowing through the coolant-carrying channels 150 for transfer away from the electronics card and heat spreader subassembly.

In one embodiment, heat pipe 131a embedded within heat spreader 119a is a copper heat pipe which is configured to reduce the thermal spreading resistance of the heat spreader. Heat dissipated by the electronics card components is conducted to opposing ends of the assembly and down to cold rails 114a. An indium thermal interface material may be employed between the heat spreaders and cold rails to facilitate thermal conduction of heat into the cold rails.

The above-discussed solutions are advantageous for, for instance, electronics card implementations with a heat dissipation of, for instance, 50 watts each. Future electronic system implementations may require the electronics cards to dissipate heat in excess of 100 watts each. In such a case, a more direct liquid-cooling implementation is believed to be advantageous.

Disclosed hereinbelow with reference to the embodiments of FIGS. 7-11B are enhanced cooling apparatuses, coolant-cooled electronic assemblies, and methods of fabrication thereof, which efficiently transfer heat from electronics cards, such as from electronic components on the cards, including DRAMs, ASICs, and other heat sources. In one embodiment, the electronics card may be an in-line memory module card or dual-in-line memory (DIMM) card, and heat is transferred to a thermal transfer structure comprising one or more coolant-carrying channels that more directly couple (or integrate) to the electronic components of the electronics card. This electronics card and thermal transfer structure subassembly is fluidically and mechanically connected via fluidic and mechanical attachment mechanisms at opposite ends of the subassembly to coolant supply and return manifold structures which facilitate the flow of liquid coolant through the coolant-carrying channels of the thermal transfer structures. Mechanical connection may be made via threaded fasteners, such as threaded bolts, in the thermally conductive extensions at the ends of the thermal transfer structures, and O-rings are used to ensure a liquid-tight, fluidic coupling between the fluidic and mechanical attachment mechanisms and the coolant supply and return manifold structures.

Two different types of fluidic and mechanical attachment mechanisms are provided herein by way of example only. These include the use of hollow threaded connectors with one or more lateral openings that allow an axial flow of coolant through the fasteners, or the use of threaded connectors with annulus coolant flow about the connectors. For instance, using hollow threaded connectors as an example, on the supply side, coolant enters the fluidic and mechanical attachment mechanism through the hollow shaft of the hollow threaded connector, and exits through the one or more lateral openings into a chamber in, for instance, a thermally conductive extension of a thermal spreader of the thermal transfer structure coupled to the electronics card. From the chamber, coolant flows through the one or more coolant-carrying channels of the thermal transfer structure, and coolant flow is the same, but in an opposite direction, on the return side of the thermal transfer structure. The chamber facilitates maintaining a consistent pressure drop through the one or more coolant-carrying channels of the thermal transfer structure, despite the end position or orientation of the hollow threaded fastener, for instance, relative to the one or more coolant-carrying channels associated with the thermal spreader of the thermal transfer structure. In the annulus flow embodiment, the liquid coolant travels about the perimeter of the threaded fastener shaft, forming an annulus flow between the respective manifold structure and the one or more coolant-carrying channels of the thermal transfer structure coupled to the electronics card.

Generally stated, described herein with reference to FIGS. 7-11B are cooling apparatuses implementing active cooling approaches for increased cooling efficiency. These cooling apparatuses are particularly advantageous for use with electronics cards, such as in-line memory module cards or DIMM cards, designed to be closely spaced when operatively positioned within an electronic system, such as a central processor complex (CPC) or central electronic complex (CEC) (as described above in connection with the embodiment of FIGS. 1-6). The cooling apparatus includes, for instance, a thermal transfer structure, one or more coolant manifold structures, and one or more fluidic and mechanical attachment mechanisms. The thermal transfer structure is configured to couple to at least one side of an electronics card comprising one or more electronic components to be cooled. The electronics card operatively docks within a socket or a connector of an electronic system, and the thermal transfer structure includes a thermal spreader configured to couple to at least one side of the electronics card, and includes at least one coolant-carrying channel associated with the thermal spreader for removing heat from the thermal spreader to coolant flowing through the coolant-carrying channel(s). The coolant manifold structure is disposed adjacent to the socket within which the electronics card operatively docks, and the fluidic and mechanical attachment mechanisms selectively, fluidically and mechanically couple or decouple the thermal transfer structure and coolant manifold structure(s). The fluidic and mechanical attachment mechanism facilitates the flow of coolant between the coolant manifold structure and the at least one coolant-carrying channel of the thermal transfer structure.

In the embodiments described below, the coolant manifold structure is, for instance, a coolant supply manifold structure, and the cooling apparatus further includes a coolant return manifold structure. The coolant supply manifold structure and coolant return manifold structure are disposed at opposite ends or edges of the socket within which the electronics card is operatively docked. The fluidic and mechanical attachment mechanism is a first fluidic and mechanical attachment mechanism fluidically and mechanically coupling the thermal transfer structure and coolant supply manifold structure, and the cooling apparatus further includes a second fluidic and mechanical attachment mechanism which fluidically and mechanically attaches the thermal transfer structure and coolant return manifold structure to facilitate the flow of coolant through the coolant-carrying channel(s) of the thermal transfer structure.

The coolant manifold structures are, in one embodiment, thermally conductive structures, and the fluidic and mechanical attachment mechanisms are configured to fluidically and mechanically couple the respective thermal transfer structure and the coolant manifold structure(s), and to facilitate thermal conduction of heat from the thermal spreaders of the thermal transfer structures to the coolant manifold structure(s) disposed at opposite edges of the socket to which the electronics card docks. In one embodiment, one or more rows of closely-spaced sockets, and thus, closely spaced electronics cards, may be provided within the electronic system, one or more of which may have a respective thermal transfer structure coupled thereto.

As described further herein, the fluidic and mechanical attachment mechanism may include a threaded fastener which couples the thermal transfer structure and coolant manifold structure together. In one embodiment, the threaded fastener comprises a hollow threaded fastener with at least one lateral opening in the hollow threaded fastener. The hollow threaded fastener and the at least one lateral opening facilitate the axial flow of coolant through the threaded fastener and between the respective coolant manifold structure and coolant-carrying channel of the thermal transfer structure. At least one of the thermal transfer structure or the fluidic and mechanical attachment mechanism include a connection chamber in fluid communication with the coolant-carrying channel and the at least one lateral opening in the hollow threaded fastener. The connection chamber facilitates maintaining a consistent pressure drop through the coolant-carrying channel(s) independent of the orientation of the lateral opening(s) in the hollow threaded fastener of the fluidic and mechanical attachment mechanism relative to, for instance, the coolant-carrying channel(s).

In an alternate embodiment, the fluidic and mechanical attachment mechanism is configured such that there is an annular flow of coolant about the threaded fastener which couples the thermal transfer structure and respective coolant manifold structure.

In the embodiments disclosed herein, the fluidic and mechanical attachment mechanisms comprise or reside within (depending on the implementation) thermally conductive extensions of (or attached to) the respective thermal spreaders at the edges thereof. These extensions are configured to mechanically and thermally couple to the upper surfaces of the respective coolant manifold structures with operative insertion of the associated electronics card into a socket of the electronic system. A threaded opening may be disposed coplanar with or parallel to the upper surface of the coolant manifold structure to engageably receive a threaded fastener of the fluidic and mechanical attachment mechanism. In the hollow threaded fastener embodiment described above, the threaded opening of the manifold structure is disposed at the upper surface thereof, and in the annular flow threaded fastener embodiment, the threaded opening is disposed, for instance, in a base of the coolant manifold structure.

Figure 7:
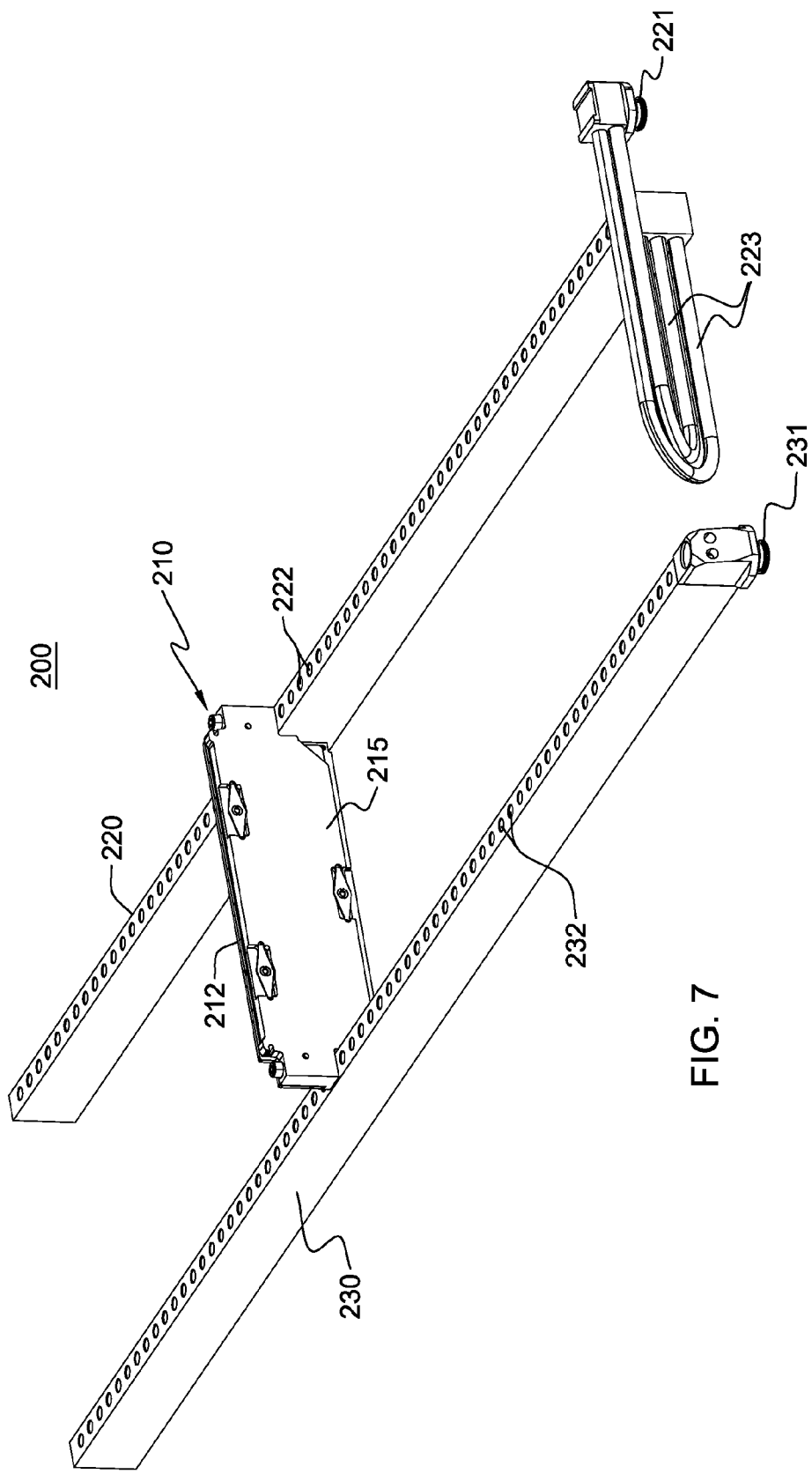
FIG. 7 is a partial depiction of another embodiment of a cooling apparatus, wherein a thermal transfer structure is shown coupled to an electronics card, and is fluidically and mechanically attached to a coolant supply manifold structure and a coolant return manifold structure, in accordance with one or more aspects of the present invention.

FIG. 7 partially depicts one embodiment of a cooling apparatus, generally denoted 200, in accordance with one or more aspects of the present invention. As illustrated, an electronics card 212 has mechanically coupled thereto a thermal transfer structure 215 such that an electronics card and thermal transfer structure subassembly 210 is defined. The electronics card 212 is shown operatively positioned between two coolant manifold structures, that is, a coolant supply manifold structure 220 and a coolant return manifold structure 230, each of which includes a plurality of threaded openings 222, 232, respectively, in the upper surface thereof. Coolant, such as water, is supplied via a coolant inlet 221 and one or more coolant-carrying tubes 223 to coolant supply manifold structure 220, and is returned via a coolant outlet 231 of coolant return manifold structure 230. The plurality of threaded openings 222, 232 in the upper surfaces of the coolant supply manifold structure 220 and coolant return manifold structure 230, facilitate the parallel disposition of multiple electronics card and thermal transfer structure subassemblies 210 in close proximity. In such a configuration, respective sockets or connectors (see FIG. 1) are provided within the electronic system for operatively receiving each electronics card therein. As described herein, in one embodiment, the electronics card 212 may comprise, for instance, a dual-in-line memory module, which contains a plurality of electronic components to be cooled, such as dynamic random access memory (DRAM) chips and ASIC chips. Note that the electronic system may include more than one rows of electronics card and thermal transfer structure subassemblies, such as discussed herein, with one row being shown in FIG. 7 by way of example only.

Figure 8A:
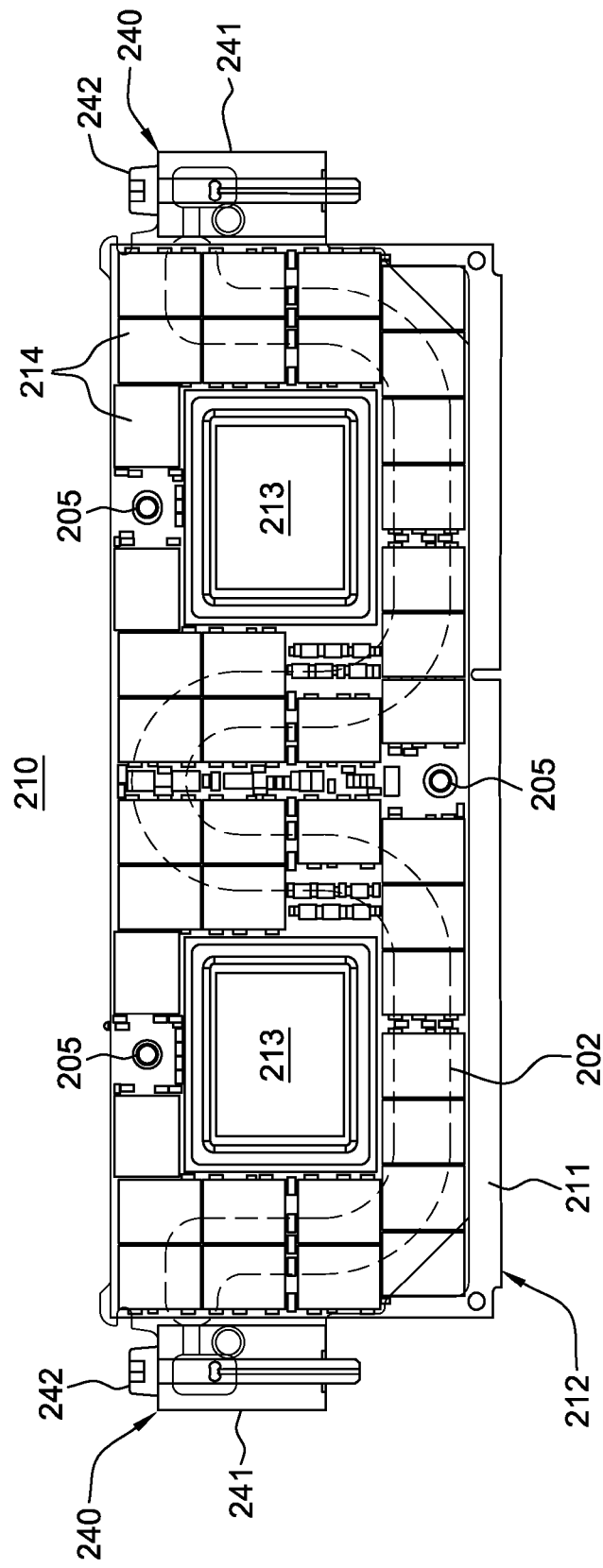
FIG. 8A is a side elevational view of one embodiment of a thermal transfer structure and electronics card subassembly looking through, at least partially, a thermal spreader of the thermal transfer structure, in accordance with one or more aspects of the present invention.
Figure 8B:
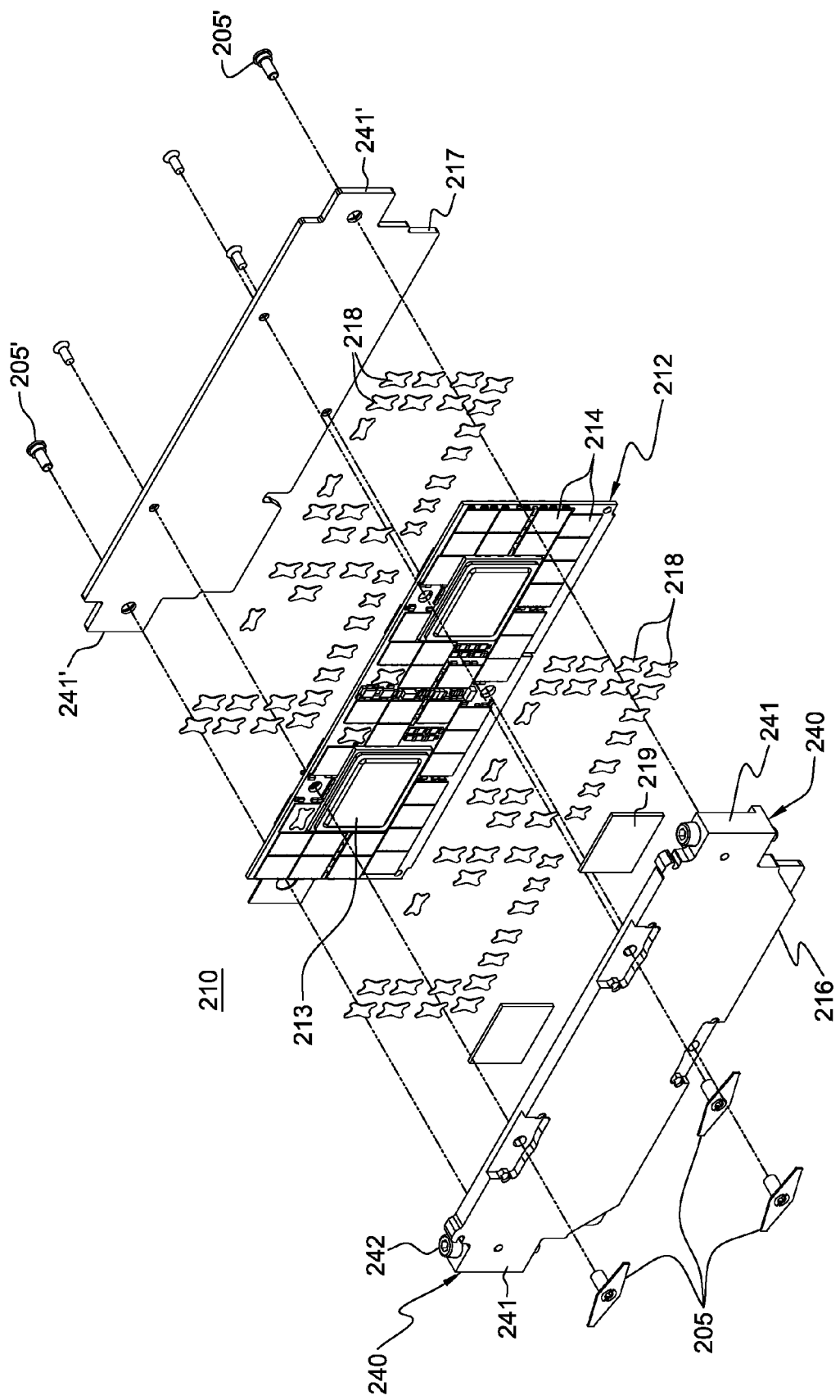
FIG. 8B is a partial exploded depiction of another embodiment of the thermal transfer structure and electronics card subassembly of FIG. 8A, in accordance with one or more aspects of the present invention.
Figure 8C:
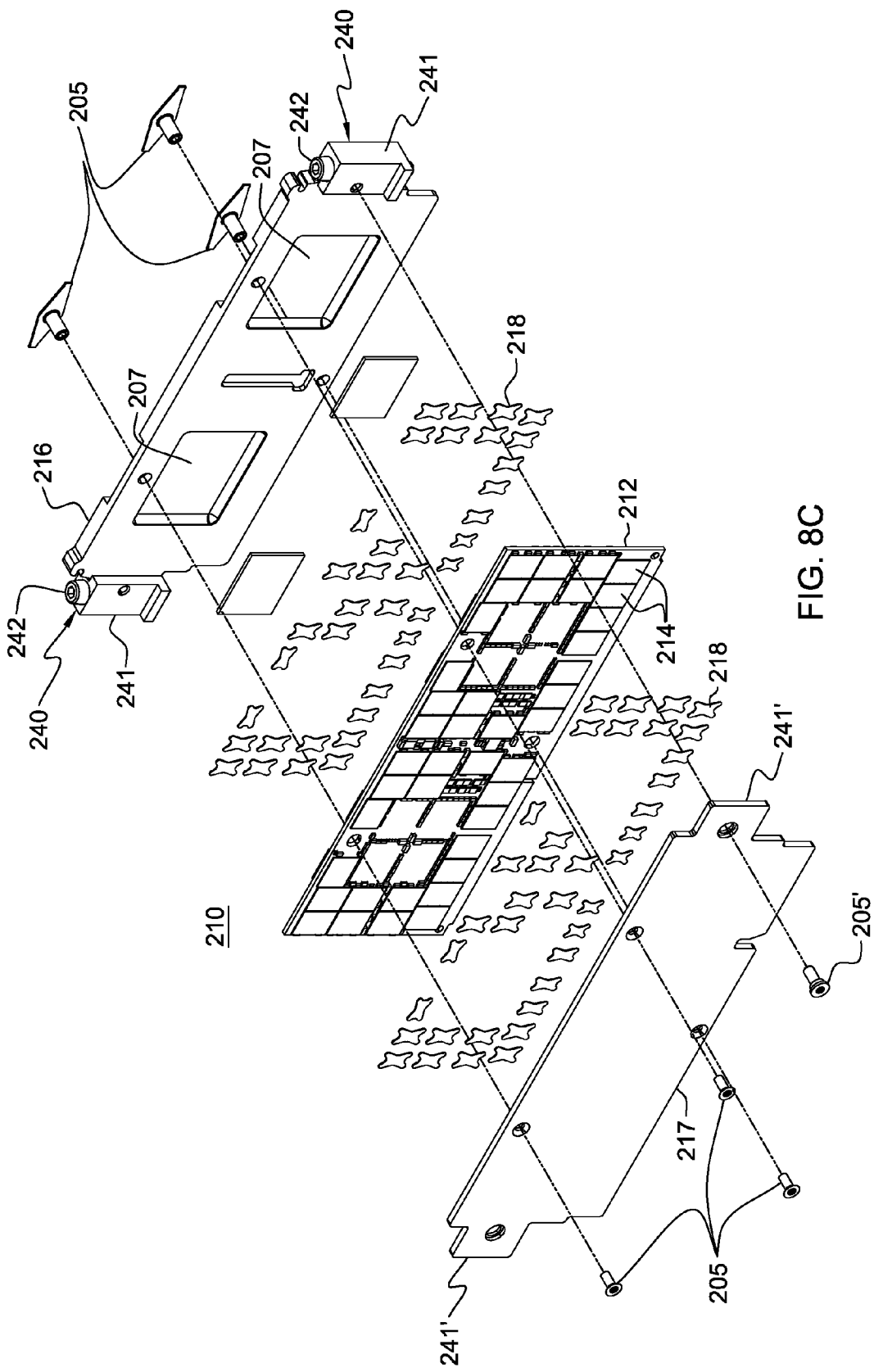
FIG. 8C depicts the partially exploded thermal transfer structure and electronics card subassembly of FIG. 8B, viewed from an opposite orientation from that of FIG. 8B, in accordance with one or more aspects of the present invention.

FIGS. 8A-8C depict embodiments of the electronics card and thermal transfer structure subassembly 210. Unless otherwise noted, referring collectively to FIGS. 8A-8C, the electronics card 212 is shown to comprise a plurality of electronic components, such as memory controllers 213 and dynamic random access memories (DRAMs) 214, arrayed on opposite main surfaces or sides of a board or substrate 211 of electronics card 212. Thermal interface material 218 is shown disposed between the DRAMs 214 on a first side of the electronics card and a first thermal spreader 216, or between the DRAMs 214 on a second side of the electronics card and a second thermal spreader 217 of the thermal transfer structure. The first thermal spreader 216 and second thermal spreader 217 are sized and configured to sandwich electronics card 212 therebetween when coupled together, for instance, via spring-biased fasteners 205. Similarly, a memory controller thermal interface material 219 may be provided between memory controllers 213 and first thermal spreader 216. As illustrated in FIG. 8C, first thermal spreader 216 may include recesses 207 on a main surface thereof, which are sized and configured to accommodate the respective memory controller cards to ensure good thermal coupling between the first thermal spreader and the electronic components on the one side of electronics card 212, and thereby good thermal conduction between the adjoining surfaces. In one embodiment, the first heat spreader and second heat spreader are each fabricated of thermally conductive material, such as a thermally conductive metal material. By way of further example, first heat spreader 216 and second heat spreader 217 may be fabricated of copper or aluminum.

In the embodiments depicted, the first thermal spreader 216 includes a coolant-carrying channel 202 extending therethrough, such as illustrated in dashed lines in FIG. 8A, which is an elevational depiction of one embodiment of the electronics card and thermal transfer structure subassembly looking into or through, at least partially, the first thermal spreader containing the coolant-carrying channel 202. In the depicted embodiment, the fluidic and mechanical attachment mechanisms 240 are disposed at opposite ends or edges of, for instance, first thermal spreader 216 within or comprising thermally conductive extensions 241 thereof. The thermally conductive extensions 241 may be integral with (see FIGS. 8B & 8C) or, for example, blocks soldered to, first thermal spreader 216 (see FIG. 8A).

Note in this embodiment, that second thermal spreader 217 further includes thermally conductive extensions 241', which (in one embodiment) are mechanically coupled via fasteners 205' to thermally conductive extensions 241 of first thermal spreader 216, for instance, to facilitate thermal conduction of heat from second thermal spreader 217 to the thermally conductive extensions 241 of first thermal spreader 216, and thereby facilitate transfer of heat from second thermal spreader to the liquid coolant flowing through the fluidic and mechanical attachment mechanisms. The attachment mechanisms are shown to include threaded fasteners 242, which facilitate coupling the thermal transfer structure, and in particular, the coolant-carrying channel(s) thereof, to respective coolant supply and return manifold structures, such as illustrated in FIG. 7, and described above. In one embodiment, the first thermal spreader (including the thermally conductive extensions thereof) may be fabricated as an aluminum plate, and the one or more channels may be defined by one or more copper tubes fitted into the aluminum plate. Alternatively, copper blocks (see FIG. 8A) may be employed as the thermally conductive extensions at the opposite edges of the first thermal spreader 216.

By way of further explanation, the thermal transfer structure may include a first thermal spreader (or cold plate) with, for instance, an embedded tube, such as an embedded copper tube. The first thermal spreader may be made of copper or aluminum, or any other highly-conductive material. This first thermal spreader is, in one embodiment, directly attached to the electronic components, such as the ACISs and DRAMs of the electronics card using, for instance, a thermal interface material. Thus, an integrated, liquid-cooled subassembly is defined.

The tube(s) within the first thermal spreader facilitates the flow of liquid coolant from one end edge to the other end edge, that is, from one thermally conductive extension to the other. The tube may be press-fitted into an appropriately sized opening in the first thermal spreader, resulting in deforming the tube into a "D" shaped cross-section to maximize the contact area with the thermal spreader. The tube may be epoxied into the thermal spreader and, for instance, brazed to (FIG. 8A) or integrated with (FIGS. 8B & 8C) the thermally conductive extensions disposed at the opposite end edges of the thermal spreader. Flow of liquid coolant through the one or more coolant-carrying channels defined by the tube(s) enhances thermal performance of the electronics card by, for instance, convecting heat dissipated by the electronic components from the thermal spreaders directly to the liquid coolant flowing through the coolant-carrying channel(s).

Assuming that electronic components are also disposed on the second main side of the electronics card, and that these components need to be cooled, then the second thermal spreader, such as a second aluminum spreader, may be included as part of the thermal transfer structure. The first and second thermal spreaders may be mechanically coupled together with the electronics card sandwiched therebetween using, for instance, threaded fasteners 205' at opposite edges thereof and, in the in embodiment of FIGS. 8A-8C, multiple spring-loaded fasteners 205 in the middle of the plates, which apply a spring-biased force between the plates to minimize thermal interface resistance to the electronic components of the card on the opposite sides of the card. Heat generated by electronic components on the first side of the electronics card is directly transferred to the first thermal spreader, and heat transferred to the second thermal spreader may be spread to the thermal conductive extensions thereof, which in the embodiments of FIGS. 8A-8C are coupled to the extensions of the first heat spreader (or the attached thermally conductive blocks), and eventually to the liquid coolant passing therethrough.

Figure 9:
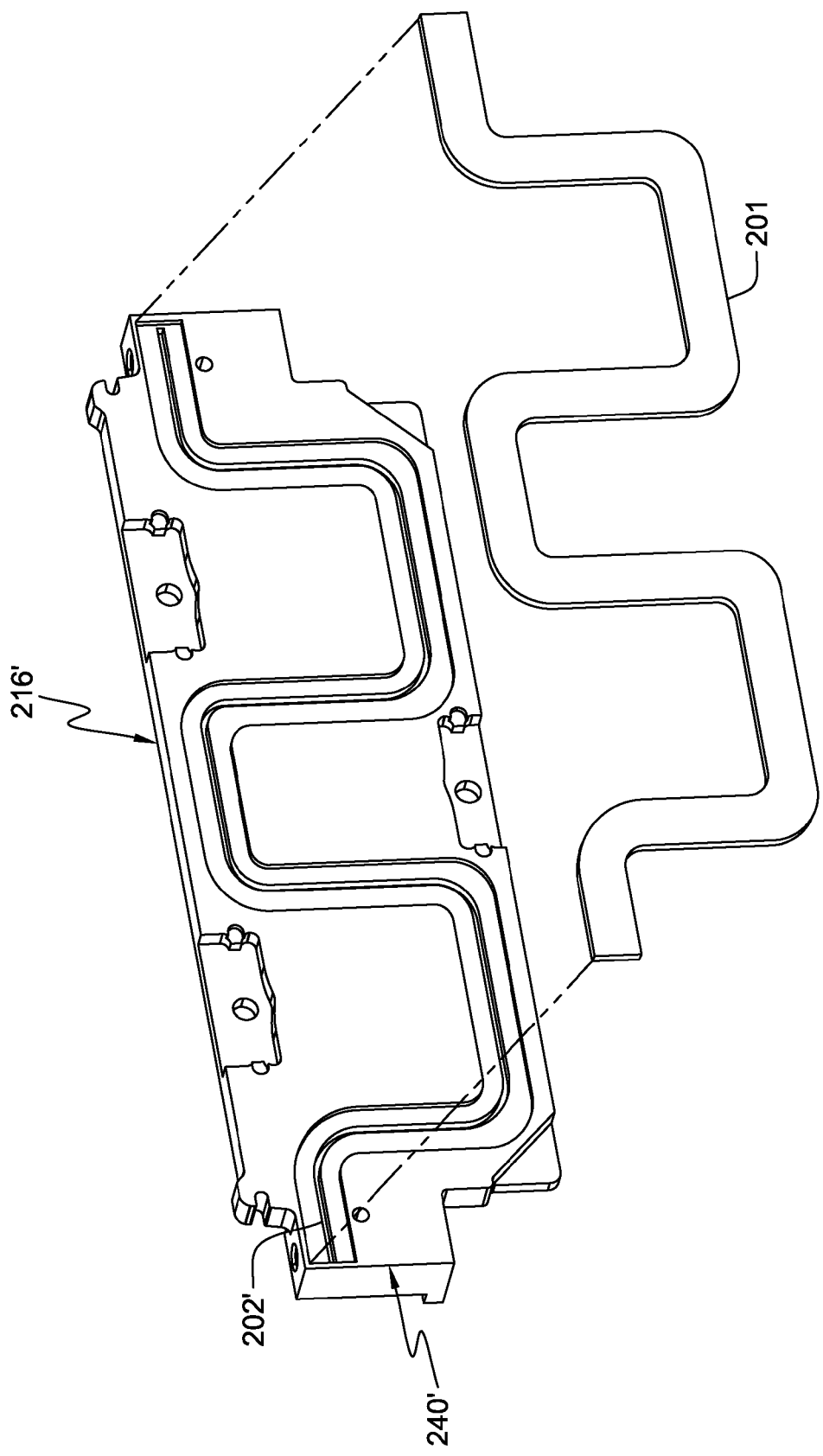
FIG. 9 depicts an alternate embodiment of a thermal transfer structure of a cooling apparatus, in accordance with one or more aspects of the present invention.
Figure 10E:
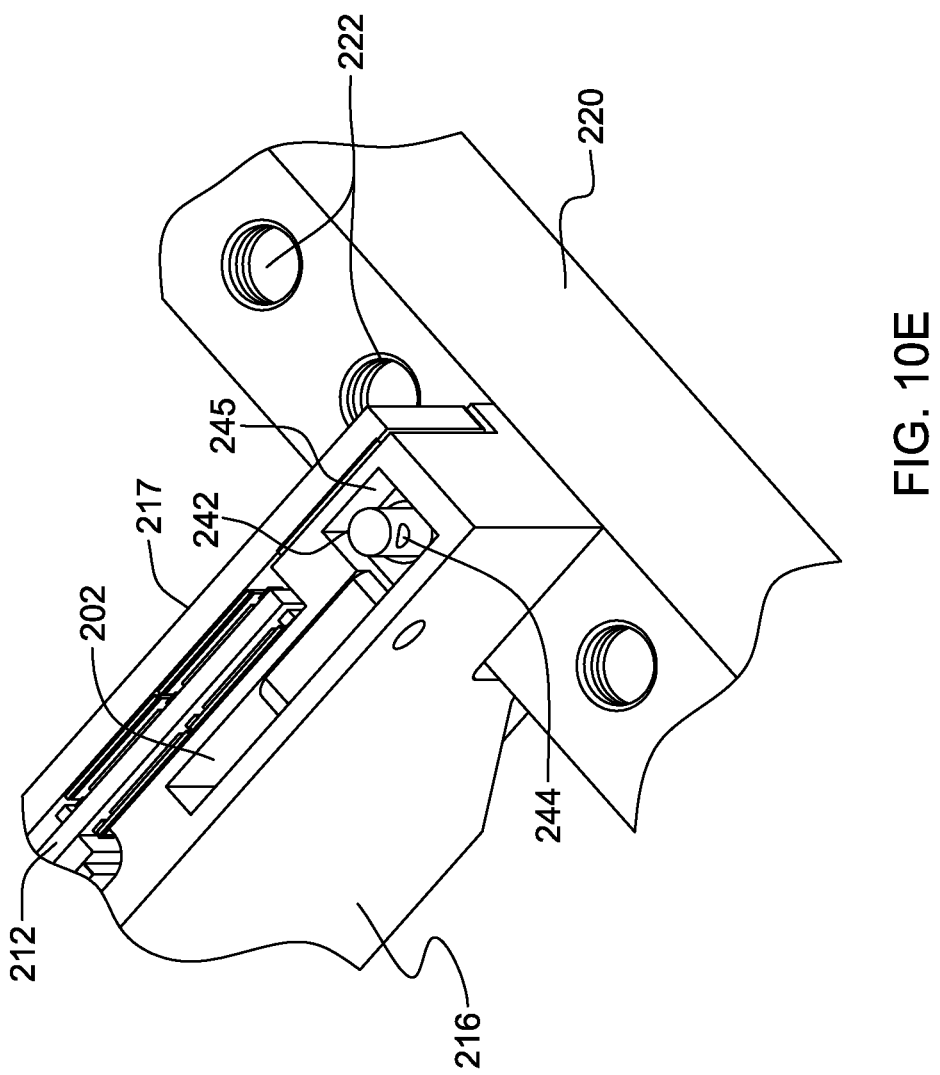
FIG. 10E is a partial transverse cross-sectional view of the thermal transfer structure and electronics card subassembly of FIG. 10A, in accordance with one or more aspects of the present invention.

FIG. 9 depicts an alternate embodiment of a first thermal spreader 216'. This alternate embodiment could comprise a single-piece cold plate with one or more coolant-carrying channels 202' defined therein, and a cover 201, such as a metal cover brazed or soldered to the thermal spreader to seal the coolant-carrying channel(s) where the coolant flows through the thermal spreader. In this implementation, the thermal spreader could be casted or machined, with the blocks of the embodiment of FIG. 8A being eliminated and the extensions integrated as part of the main body of the thermal spreader. Note that this variation may be employed with any of the fluidic and mechanical attachment mechanisms described herein. By way of example only, the thermal spreader 216' and cover 201 may be fabricated of copper.

FIGS. 10A-10E depict the cooling apparatus embodiment of FIGS. 7, 8B & 8C described above, with the thermally conductive extensions being formed integral with the respective first and second thermal spreaders 216, 217. In this embodiment, the electronics card and thermal transfer structure subassembly 210 is shown operatively positioned between coolant supply manifold structure 220 and coolant return manifold structure 230. Referring collectively to FIGS. 10A-10E, one embodiment of the fluidic and mechanical attachment mechanism is depicted. In this embodiment, fluidic and mechanical coupling of the thermal transfer structure to the coolant supply and return manifolds 220, 230 is achieved using fasteners 242, which are hollow threaded fasteners that respectively facilitate a fluid-tight coupling between the one or more coolant-carrying channels 202 of the thermal transfer structure and the supply manifold 225 of coolant supply manifold structure 220, as well as the return manifold 235 of coolant return manifold structure 230.

As illustrated in FIGS. 10A-10D, the hollow threaded fastener 242 includes an axial flow passageway 243 through the hollow threaded fastener 242, extending between a threaded end of the hollow threaded fastener, which makes threaded mechanical connection to a threaded opening 222 of the coolant supply manifold structure 220, or a threaded opening 232 of the coolant return manifold structure 230, and a transverse flow passageway or lateral opening 244 in the hollow threaded fastener 242. An upper O-ring seal 246 is disposed between hollow threaded fastener 242 and an upper surface of the thermally conductive extension 241 of first thermal spreader 216, and a lower O-ring 247 is disposed between a lower surface of the thermally conductive extension 241 and an upper surface of the respective manifold structure, such as the upper surface of the return manifold structure 230, as illustrated in FIGS. 10B-10D.

As shown in FIGS. 10A-10E, a fluid connection chamber 245 resides within the thermally conductive extension 241 about the lateral or transverse coolant flow openings 244. This chamber 245 facilitates maintaining a consistent pressure drop through the one or more coolant-carrying channels 202 of the thermal spreaders 216 of multiple thermal transfer structures, notwithstanding different orientations of the lateral coolant flow openings 244 in the hollow threaded fasteners 242 of the fluidic and mechanical attachment mechanisms relative to, for instance, the coolant-carrying channel(s) 202. In the embodiment of FIGS. 10A-10E, a fastener 205' is also illustrated within the thermally conductive extensions at the end edges of the first and second thermal spreaders 216, 217. These fasteners 205' facilitate good mechanical and thermal coupling between the thermally conductive extensions 241, 241' of the first and second thermal spreaders which, in this embodiment, sandwich the electronics card to be cooled. A thermal interface material (not shown) such as discussed above may be disposed between the thermally conductive extensions 241' of the second thermal spreader 217 and the thermally conductive extensions 241 of the first thermal spreader 216.

In operation, on the supply side, liquid coolant (such as water) enters the fluidic and mechanical attachment mechanism through the hollow shaft of the threaded fastener 242, and exits through the lateral opening(s) 244, into the fluid connection chamber 245, which is in fluid communication with the coolant-carrying channel(s) 202 of the thermal transfer structure, or more particularly, the first thermal spreader 216. On the return side, coolant exits the coolant-carrying channel 202 into a fluid connection chamber 245 and from the connection chamber, into the lateral opening(s) 244 of the hollow threaded fastener, through the hollow shaft 243 of the fastener, and down into the return manifold 235 of the return manifold structure 230. O-rings are employed between the thermally conductive extensions of the first thermal spreader and the fasteners and the manifold surfaces to which the extensions mate when the threaded fasteners are threadably attached to respective threaded openings in the manifold structures. When the thermal transfer structure is fully engaged, that is, the hollow threaded fastener is fully, threadably connected to the respective threaded opening of the manifold structure, the lateral or transverse coolant flow opening(s) 244 is disposed within the fluid connection chamber 245 which, as noted, facilitate consistent pressure drop through the coolant-carrying channels of multiple thermal transfer structures, that is, where more than one thermal transfer structure is disposed within the cooling apparatus, as discussed and illustrated herein. This is because the lateral openings in the hollow fasteners will not always be disposed in the same location relative to, for example, the respective coolant-carrying channel. Note that although the thermally conductive extensions are shown as integral with the first thermal spreaders in the embodiment of FIGS. 10A-10E, the thermally conductive extensions could alternatively comprise thermally conductive blocks affixed to the thermal spreaders, as in the embodiment of FIG. 8A.

FIGS. 11A & 11B depict an alternate fluidic and mechanical attachment mechanism embodiment. In this embodiment, coolant flow is via an annulus flow passage 248 about a threaded connector 242', which is a solid threaded connector in one embodiment.

Referring collectively to FIGS. 11A-11B, the fluidic and mechanical attachment mechanism is illustrated (by way of example) as coupling the coolant-carrying channel(s) 202" of a first thermal spreader 216' of a thermal transfer structure, and a return manifold 235' of a coolant return manifold structure 230'. As in the above-described embodiments, the first thermal spreader 216' is mechanically coupled to one side of an electronics card 212, and a second thermal spreader 217 is mechanically coupled to an opposite side of electronics card 212 such that the electronics card is sandwiched between the first thermal spreader 216' and second thermal spreader 218. The first thermal spreader includes thermally conductive extensions 241", and the second thermal spreader 217 includes thermally conductive extensions 241', which mechanically couple via fasteners 205'. A thermal interface material may be employed between the thermally conductive extensions to facilitate, for instance, thermal conduction of heat from the second thermal spreader 217 to the first thermal spreader 216', and hence to the liquid coolant flowing through the fluidic and mechanical attachment mechanism associated with or comprising the thermally conductive extension 241" of the first thermal spreader 216'.

As illustrated, threaded fastener 242' threadably engages a threaded opening 236 in a base 237 of the respective manifold structure, for instance, the return manifold structure 230'. In this embodiment, openings 232' in the upper surface of the manifold structure 230' have a larger diameter than a diameter of the threaded fastener 242'. Similarly, an annulus coolant flow passage 248 is provided within the thermally conductive extension 241" between, for instance, a fluid connection chamber 245 and the lower surface of the thermally conductive extension 241" that is coupled to the upper surface of the return manifold. Thus, as can be understood from FIG. 11B, an annular flow of coolant may be provided about the threaded fastener 242' between the one or more coolant-carrying channels 202" of the first thermal spreader 216', and the respective manifold, for instance, return manifold 235' of the return manifold structure 230'. An upper O-ring seal 246 is provided between the threaded fastener 242' and an upper surface of the thermally conductive extension 241", and a lower O-ring seal 247 is provided between the lower surface of the thermally conductive extension 241" and the upper surface of the respective manifold structure 230'. These seals facilitate fluid-tight coupling between the thermal transfer structure and the coolant manifold structure. Note that the fluidic and mechanical attachment mechanism may be readily coupled or decoupled to their respective manifold structure by rotatably actuating the threaded fasteners 242', and lifting the electronics card assembly from its respective socket or chamber.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
   a thermal transfer structure configured to couple to at least one side of an electronics card comprising one or more electronic components to be cooled, the electronics card operatively docking within a socket of an electronic system, and the thermal transfer structure comprising:
      a thermal spreader comprising a plate to couple to the at least one side of the electronics card, the plate comprising an extension at a side edge of the thermal spreader; and
      at least one coolant-carrying channel associated with the thermal spreader for removing heat from the thermal spreader to liquid coolant flowing through the at least one coolant-carrying channel, the at least one coolant-carrying channel extending into the extension of the thermal spreader;
   a coolant manifold structure disposed at an end of the socket of the electronic system within which the electronics card is to operatively dock, the coolant manifold structure including an opening in a surface thereof extending into a liquid-coolant-carrying compartment of the coolant manifold structure; and
   an attachment mechanism which selectively, fluidically and mechanically couples or decouples the thermal transfer structure and the coolant manifold structure, the attachment mechanism facilitating the flow of liquid coolant between the coolant manifold structure and the at least one coolant-carrying channel of the thermal transfer structure, and the attachment mechanism comprising:
      a fastener extending through the extension in the thermal spreader, including through the at least one coolant-carrying channel within the extension, wherein the fastener extends into the opening in the surface of the coolant manifold structure and facilitates mechanically coupling the thermal transfer structure to the coolant manifold structure, and when mechanically coupled, the at least one coolant-carrying channel of the thermal transfer structure is also in fluid communication with the liquid-coolant-carrying compartment of the coolant manifold structure through the opening in the surface of the coolant manifold structure.

2. The cooling apparatus of claim 1, wherein the coolant manifold structure is a thermally conductive structure.

3. The cooling apparatus of claim 1, wherein the fastener of the attachment mechanism comprises a threaded fastener which couples the thermal transfer structure and coolant manifold structure together.

4. The cooling apparatus of claim 3, wherein the threaded fastener comprises a hollow shaft and at least one lateral opening, the hollow shaft and at least one lateral opening facilitating the flow of coolant through the threaded fastener and between the coolant manifold structure and the at least one coolant-carrying channel associated with the thermal spreader of the thermal transfer structure.

5. The cooling apparatus of claim 4, wherein at least one of the thermal transfer structure or the attachment mechanism comprises a chamber in fluid communication with the at least one coolant-carrying channel and the at least one lateral opening in the threaded fastener, the chamber facilitating a consistent pressure drop through the at least one channel independent of orientation of the at least one lateral opening in the threaded fastener of the attachment mechanism relative to the at least one coolant-carrying channel.

6. The cooling apparatus of claim 3, wherein the attachment mechanism is configured to facilitate an annular flow of coolant about the threaded fastener between the at least one coolant-carrying channel of the thermal transfer structure and the coolant manifold structure.

7. The cooling apparatus of claim 1, wherein the surface of the coolant manifold structure is an upper surface of the coolant manifold structure, the extension of the thermal spreader contacting the upper surface of the coolant manifold structure with operative insertion of the electronics card into the socket of the electronic system.

8. The cooling apparatus of claim 7, wherein the opening in the surface of the coolant manifold structure is a threaded opening, and wherein the fastener threadably couples to the threaded opening to couple the thermal transfer structure and coolant manifold structure together.

9. The cooling apparatus of claim 1, wherein the coolant manifold structure comprises one of a coolant supply manifold structure or a coolant return manifold structure.

10. The cooling apparatus of claim 9, wherein the coolant manifold structure comprises an elongate rail extending transverse to the socket.

11. A cooling apparatus comprising:
    a thermal transfer structure configured to couple to at least one side of an electronics card comprising one or more electronic components to be cooled, the electronics card operatively docking within a socket of an electronic system, and the thermal transfer structure comprising:

a thermal spreader configured to couple to the at least one side of the electronics card; and at least one coolant-carrying channel associated with the thermal spreader for removing heat from the thermal spreader to coolant flowing through the at least one coolant-carrying channel;

a coolant manifold structure disposed adjacent to the socket of the electronic system within which the electronics card is to operatively dock; and a fluidic and mechanical attachment mechanism which selectively, fluidically and mechanically couples or decouples the thermal transfer structure and coolant manifold structure, the fluidic and mechanical attachment mechanism facilitating the flow of coolant between the coolant manifold structure and the at least one coolant-carrying channel of the thermal transfer structure; and wherein the thermal spreader comprises a first thermal spreader, and wherein the thermal transfer structure further comprises a second thermal spreader, the first thermal spreader and the second thermal spreader being configured to couple to opposite sides of the electronics card and each comprising at least one thermally conductive extension extending past the electronics card when the first and second thermal spreaders are coupled together with the electronics card sandwiched between the first and second thermal spreaders, the thermally conductive extensions being configured to thermally couple together to facilitate thermal conduction of heat from the second thermal spreader to the first thermal spreader with the at least one coolant-carrying channel associated therewith.

12. A coolant-cooled electronic assembly comprising:
an electronic system, the electronic system comprising:
  an electronics card comprising one or more electronic components to be cooled;
  a socket operatively receiving the electronics card; and
  a cooling apparatus comprising:
    a thermal transfer structure coupled to at least one side of the electronics card, the thermal transfer structure comprising:
      a thermal spreader comprising a plate to couple to the at least one side of the electronics card, the plate comprising an extension at a side edge of the thermal spreader; and
      at least one coolant-carrying channel associated with the thermal spreader for removing heat from the thermal spreader to liquid coolant flowing through the at least one coolant-carrying channel, the at least one coolant-carrying channel extending into the extension of the thermal spreader;
    a coolant manifold structure disposed at an end of the socket of the electronic system within which the electronics card is to operatively dock, the coolant manifold structure including an opening in a surface thereof extending into a liquid-coolant-carrying compartment of the coolant manifold structure; and
    an attachment mechanism which selectively, fluidically and mechanically couples or decouples the thermal transfer structure and the coolant manifold structure, the attachment mechanism facilitating the flow of liquid coolant between the coolant manifold structure and the at least one coolant-carrying channel of the thermal transfer structure, and the attachment mechanism comprising:
      a fastener extending through the extension in the thermal spreader, including through the at least one coolant-carrying channel within the extension, wherein the fastener extends into the opening in the surface of the coolant manifold structure and facilitates mechanically coupling the thermal transfer structure to the coolant manifold structure, and when mechanically coupled, the at least one coolant-carrying channel of the thermal transfer structure is also in fluid communication with the liquid-coolant-carrying compartment of the coolant manifold structure through the opening in the surface of the coolant manifold structure.

13. The coolant-cooled electronic assembly of claim 12, wherein the coolant manifold structure comprises one of a coolant supply manifold structure or a coolant return manifold structure.

14. The coolant-cooled electronic assembly of claim 13, wherein the coolant manifold structure is thermally conductive.

15. The coolant-cooled electronic assembly of claim 13, wherein the fastener of the attachment mechanism comprises a threaded fastener which couples the thermal transfer structure and coolant manifold structure together.

16. The cooling apparatus of claim 15, wherein the threaded fastener comprises a hollow shaft and at least one lateral opening, the hollow shaft and at least one lateral opening facilitating the flow of coolant through the threaded fastener and between the coolant manifold structure and the at least one coolant-carrying channel associated with the thermal spreader of the thermal transfer structure.

17. The cooling apparatus of claim 16, wherein at least one of the thermal transfer structure or the attachment mechanism comprises a chamber in fluid communication with the at least one coolant-carrying channel and the at least one lateral opening in the threaded fastener, the chamber facilitating a consistent pressure drop through the at least one channel independent of orientation of the at least one lateral opening in the threaded fastener of the attachment mechanism relative to the at least one coolant-carrying channel.

18. The coolant-cooled electronic assembly of claim 15, wherein the attachment mechanism is configured to facilitate an annular flow of coolant about the threaded fastener between the at least one coolant-carrying channel of the thermal transfer structure and the coolant manifold structure.

19. The coolant-cooled electronic assembly of claim 12, wherein the surface of the coolant manifold structure is an upper surface of the coolant manifold structure, the extension of the thermal spreader contacting the upper surface of the coolant manifold structure with operative insertion of the electronics card into the socket of the electronic system.

20. The coolant-cooled electronic assembly of claim 19, wherein the opening in the surface of the coolant manifold structure is a threaded opening, and wherein the fastener threadably couples to the threaded opening to couple the thermal transfer structure and coolant manifold structure together.

* * * * *